United States Patent
Salcedo

(10) Patent No.: US 8,637,899 B2
(45) Date of Patent: Jan. 28, 2014

(54) METHOD AND APPARATUS FOR PROTECTION AND HIGH VOLTAGE ISOLATION OF LOW VOLTAGE COMMUNICATION INTERFACE TERMINALS

(75) Inventor: Javier A. Salcedo, North Billerica, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/492,677

(22) Filed: Jun. 8, 2012

(65) Prior Publication Data

US 2013/0328103 A1    Dec. 12, 2013

(51) Int. Cl.
*H01L 29/66* (2006.01)

(52) U.S. Cl.
USPC .......................................... 257/173; 257/546

(58) Field of Classification Search
USPC .................................................. 257/173, 546
See application file for complete search history.

(56) References Cited

U.S. PATENT DOCUMENTS

| | | | |
|---|---|---|---|
| 3,436,667 A | 4/1969 | Kedson | |
| 4,633,283 A | 12/1986 | Avery | |
| 5,061,652 A | 10/1991 | Bendernagel et al. | |
| 5,276,582 A | 1/1994 | Merrill et al. | |
| 5,341,005 A | 8/1994 | Canclini | |
| 5,343,053 A | 8/1994 | Avery | |
| 5,652,689 A | 7/1997 | Yuan | |
| 5,663,860 A | 9/1997 | Swonger | |
| 5,742,084 A | 4/1998 | Yu | |
| 5,781,389 A | 7/1998 | Fukuzako et al. | |
| 5,889,644 A | 3/1999 | Schoenfeld et al. | |
| 5,895,940 A * | 4/1999 | Kim | 257/173 |
| 5,998,813 A * | 12/1999 | Bernier | 257/175 |
| 6,137,140 A | 10/2000 | Efland et al. | |

(Continued)

FOREIGN PATENT DOCUMENTS

| | | |
|---|---|---|
| DE | 10 2007 040 875 A1 | 3/2009 |
| EP | 0 168 678 A2 | 1/1986 |
| EP | 1 703 560 A2 | 9/2006 |

OTHER PUBLICATIONS

Salcedo et al., *Bidirectional Devices for Automotive-Grade Electrostatic Discharge Applications*, IEEE Electron Device Letters, vol. 33, No. 6, Jun. 2012, 3 pages.

(Continued)

*Primary Examiner* — Eugene Lee
(74) *Attorney, Agent, or Firm* — Knobbe, Martens, Olson & Bear LLP

(57) ABSTRACT

A high voltage isolation protection device for low voltage communication interface systems in mixed-signal high voltage electronic circuit is disclosed. According to one aspect, the protection device includes a semiconductor structure configured to provide isolation between low voltage terminals and protection from transient events. The protection device includes a thyristor having an anode, a cathode, and a gate, and a thyristor cathode-gate control region that is built into the protection device. The protection device is configured to provide multiple built-in path-up to power-high terminals and path-down to power-low terminals at different voltage levels. The protection device also includes independently built-in discharge paths to the common substrate that is connected to a different power-low voltage reference. The conduction paths may be built into a single structure with dual isolation regions. As a result, the protection device enables superior robustness and compact protection solutions for smart power applications.

23 Claims, 14 Drawing Sheets

(56) References Cited

U.S. PATENT DOCUMENTS

| | | | |
|---|---|---|---|
| 6,144,542 A | 11/2000 | Ker et al. | |
| 6,236,087 B1 | 5/2001 | Daly et al. | |
| 6,258,634 B1 | 7/2001 | Wang et al. | |
| 6,310,379 B1 | 10/2001 | Andresen et al. | |
| 6,329,694 B1 | 12/2001 | Lee et al. | |
| 6,404,261 B1 | 6/2002 | Grover et al. | |
| 6,423,987 B1 * | 7/2002 | Constapel et al. | 257/173 |
| 6,512,662 B1 | 1/2003 | Wang | |
| 6,590,273 B2 | 7/2003 | Okawa et al. | |
| 6,665,160 B2 | 12/2003 | Lin et al. | |
| 6,667,870 B1 | 12/2003 | Segervall | |
| 6,704,180 B2 | 3/2004 | Tyler et al. | |
| 6,724,603 B2 | 4/2004 | Miller et al. | |
| 6,756,834 B1 | 6/2004 | Tong et al. | |
| 6,768,616 B2 | 7/2004 | Mergens et al. | |
| 6,870,202 B2 * | 3/2005 | Oka | 257/173 |
| 6,960,792 B1 | 11/2005 | Nguyen | |
| 7,034,363 B2 | 4/2006 | Chen | |
| 7,038,280 B2 | 5/2006 | Righter | |
| 7,071,528 B2 | 7/2006 | Ker et al. | |
| 7,232,705 B2 | 6/2007 | Righter | |
| 7,232,711 B2 | 6/2007 | Gambino et al. | |
| 7,335,543 B2 | 2/2008 | Chen et al. | |
| 7,345,341 B2 | 3/2008 | Lin et al. | |
| 7,385,793 B1 | 6/2008 | Ansel et al. | |
| 7,436,640 B2 | 10/2008 | Su et al. | |
| 7,566,914 B2 | 7/2009 | Salcedo et al. | |
| 7,601,991 B2 | 10/2009 | Salcedo et al. | |
| 7,714,357 B2 | 5/2010 | Hayashi et al. | |
| 7,834,378 B2 | 11/2010 | Ryu et al. | |
| 7,910,999 B2 * | 3/2011 | Lee et al. | 257/355 |
| 7,969,006 B2 | 6/2011 | Lin et al. | |
| 8,044,457 B2 | 10/2011 | Salcedo et al. | |
| 8,198,651 B2 * | 6/2012 | Langguth et al. | 257/170 |
| 8,222,698 B2 | 7/2012 | Salcedo et al. | |
| 8,368,116 B2 | 2/2013 | Salcedo et al. | |
| 8,432,651 B2 | 4/2013 | Salcedo et al. | |
| 2001/0040254 A1 | 11/2001 | Takiguchi | |
| 2002/0021538 A1 | 2/2002 | Chen et al. | |
| 2002/0122280 A1 | 9/2002 | Ker et al. | |
| 2002/0187601 A1 | 12/2002 | Lee et al. | |
| 2003/0076636 A1 | 4/2003 | Ker et al. | |
| 2004/0135229 A1 | 7/2004 | Sasahara | |
| 2004/0164354 A1 | 8/2004 | Mergens et al. | |
| 2004/0190208 A1 | 9/2004 | Levit | |
| 2004/0207021 A1 | 10/2004 | Russ et al. | |
| 2004/0240128 A1 | 12/2004 | Boselli et al. | |
| 2005/0012155 A1 | 1/2005 | Ker et al. | |
| 2005/0082618 A1 | 4/2005 | Wu et al. | |
| 2005/0087807 A1 | 4/2005 | Righter | |
| 2005/0088794 A1 | 4/2005 | Boerstler et al. | |
| 2005/0093069 A1 | 5/2005 | Logie | |
| 2005/0151160 A1 | 7/2005 | Salcedo et al. | |
| 2006/0033163 A1 | 2/2006 | Chen | |
| 2006/0109595 A1 | 5/2006 | Watanabe et al. | |
| 2006/0145260 A1 | 7/2006 | Kim | |
| 2006/0186467 A1 | 8/2006 | Pendharkar et al. | |
| 2007/0007545 A1 | 1/2007 | Salcedo et al. | |
| 2007/0158748 A1 | 7/2007 | Chu et al. | |
| 2008/0044955 A1 | 2/2008 | Salcedo et al. | |
| 2008/0067601 A1 | 3/2008 | Chen | |
| 2009/0032838 A1 | 2/2009 | Tseng et al. | |
| 2009/0230426 A1 | 9/2009 | Carpenter et al. | |
| 2009/0309128 A1 | 12/2009 | Salcedo et al. | |
| 2010/0133583 A1 * | 6/2010 | Mawatari et al. | 257/173 |
| 2010/0327343 A1 | 12/2010 | Salcedo et al. | |
| 2011/0101444 A1 | 5/2011 | Coyne et al. | |
| 2011/0110004 A1 | 5/2011 | Maier | |
| 2011/0176244 A1 | 7/2011 | Gendron et al. | |
| 2011/0284922 A1 | 11/2011 | Salcedo et al. | |
| 2011/0303947 A1 | 12/2011 | Salcedo et al. | |
| 2011/0304944 A1 | 12/2011 | Salcedo et al. | |
| 2012/0007207 A1 | 1/2012 | Salcedo | |
| 2012/0008242 A1 | 1/2012 | Salcedo | |
| 2012/0199874 A1 | 8/2012 | Salcedo et al. | |
| 2012/0205714 A1 | 8/2012 | Salcedo et al. | |
| 2012/0293904 A1 | 11/2012 | Salcedo et al. | |
| 2013/0032882 A1 | 2/2013 | Salcedo et al. | |

OTHER PUBLICATIONS

Salcedo et al., *On-Chip Protection for Automotive Integrated Circuits Robustness*, IEEE 2012 8th International Caribbean Conference on Devices, Circuits and Systems (ICCDCS), 5 pages (2012).

Anderson et al., *ESD Protection under Wire Bonding Pads*, EOS/ESD Symposium 99-88, pp. 2A.4.1-2A.4.7 (1999).

Luh et al. *A Zener-Diode-Activated ESD Protection Circuit for Sub-Micron CMOS Processes*, Circuits and Systems, IEEE International Symposium, May 28-31, 2000, Geneva, Switzerland, 4 pages.

Salcedo et al., *Electrostatic Discharge Protection Framework for Mixed-Signal High Voltage CMOS Applications*, IEEE Xplore, downloaded Feb. 23, 2010 at 12:53 EST.

* cited by examiner

METHOD AND APPARATUS FOR PROTECTION AND HIGH VOLTAGE ISOLATION OF LOW VOLTAGE COMMUNICATION INTERFACE TERMINALS

BACKGROUND

1. Field

Implementations of the invention relate to electronic systems, and more particularly, to protection and high voltage isolation of low voltage interface terminals systems for mixed-signal high voltage integrated circuits (ICs).

2. Description of the Related Technology

Certain electronic systems are configured to protect circuits or components therein from transient electrical events. A transient signal event may be in the form of an electrical signal of a relatively short duration having rapidly changing voltage and high power. Transient signal events can include, for example, electrical overstress/electrostatic discharge (EOS/ESD) events arising from the abrupt release of charge from an object or person to an electronic system.

Transient signal events can damage integrated circuits (ICs) inside an electronic system due to overvoltage conditions and/or high levels of power dissipation over relatively small areas of the ICs. Electronic circuit reliability is enhanced by integrating protection devices in an IC such that the protection devices are connected between the different pads or pins of the IC. The protection devices can be incorporated on-chip or at the system-level, and can maintain the voltage level at the pads within a predefined safe range by transitioning from a high impedance/low leakage state to a low impedance/high conductivity state when the voltage of the transient signal reaches a trigger voltage. Thereafter, the protection device can shunt the largest portion of the current associated with the transient signal before the voltage of the transient signal reaches a positive or negative failure voltage that can lead to one of the most common causes of IC damage in the field. After activation, a protection device can remain in the low-impedance state as long as the transient signal voltage level is above a positive holding voltage or below a negative holding voltage.

Complementary Metal Oxide Semiconductors (CMOS), Bipolar CMOS (BiCMOS), or Bipolar Diffused Metal Oxide Semiconductors (BiDMOS) devices may be configured to operate at input/output voltages that are a fraction of the power supply source voltage. ESD protection for these devices may also include additional discrete protection components which provide isolation between the various voltage terminals. As a result, conventional solutions which include separate isolated devices may present limitations due to excessive loading, voltage terminal isolation sensitivity, large area requirements, and added complexity to the circuit design layout and integration.

SUMMARY

The systems, methods and devices of the disclosure each have several innovative aspects, no single one of which is solely responsible for the desirable attributes disclosed herein.

According to one embodiment, an apparatus and a method of manufacturing an apparatus are disclosed. The apparatus includes a substrate of a first conductivity type, a first isolation region disposed on the substrate of a second conductivity type that is opposite to the first conductivity type, a second isolation region disposed on the first isolation region of the first conductivity type, an epitaxial layer disposed on the substrate of the first conductivity type, a thyristor region disposed on the epitaxial layer. The thyristor region includes a thyristor gate region, a thyristor anode region, a thyristor cathode region, and a thyristor cathode-gate resistance-control region. The thyristor anode region coupled to an input/output voltage terminal, and the thyristor cathode region and the cathode-gate resistance-control region are coupled to a first voltage source terminal. The apparatus also includes a first decoupling component region comprising a first decoupling component anode region at least partially abutting a first decoupling component cathode region. The first decoupling component anode region is coupled to the first voltage source terminal. The first decoupling component cathode region is coupled to the input/output voltage terminal. The apparatus also includes a second decoupling component region comprising a second decoupling component anode region at least partially abutting a second decoupling component cathode region. The second decoupling component anode region is coupled to the first voltage source terminal, and wherein the second decoupling component cathode region is coupled to a second voltage source terminal.

According to another embodiment, an apparatus and a method of manufacturing an apparatus are disclosed. The apparatus includes a substrate of a first conductivity type, a first isolation region over the substrate of a second conductivity type that is opposite to the first conductivity type, a second isolation region over the first isolation region of the first conductivity type, an epitaxial layer over the second isolation region of the first conductivity type, a thyristor having an anode coupled to an input/output voltage terminal and a cathode coupled to a first voltage source terminal, a first diode having an anode coupled to the first voltage source terminal and a cathode coupled to the input/output voltage terminal, and a second diode having an anode coupled to the first voltage source terminal and a cathode coupled to a second voltage source terminal. The thyristor, the first diode, and the second diode are each formed at least partially on a surface of the second isolation region.

DETAILED DESCRIPTION OF IMPLEMENTATIONS

Figure 1:
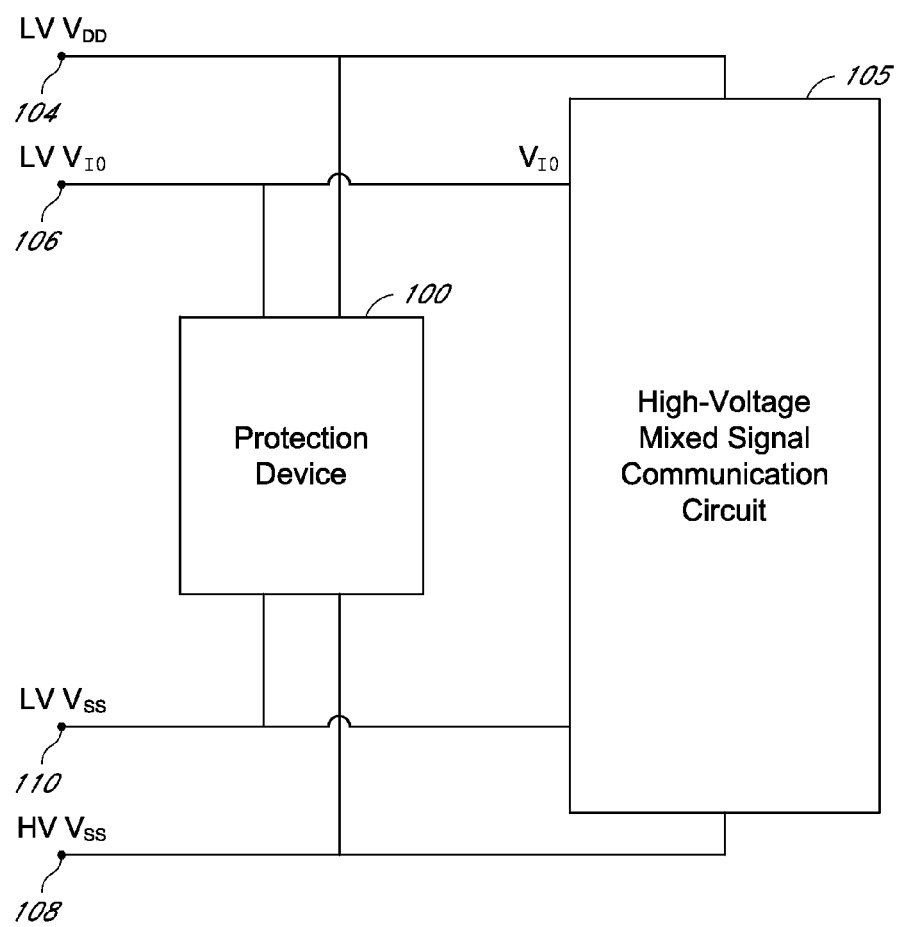
FIG. 1 is a schematic block diagram of an example of a protection device and a high-voltage mixed-signal communication circuit according to some implementations.

The following detailed description of certain implementations presents various descriptions of specific implementations of the invention. However, the invention can be embodied in a multitude of different ways as defined and covered by the claims. In this description, reference is made to the drawings where like reference numerals indicate identical or functionally similar elements.

Terms such as above, below, over and so on as used herein refer to a device orientated as shown in the figures and should be construed accordingly. It should also be appreciated that because regions within a semiconductor device (such as a transistor) are defined by doping different parts of a semiconductor material with differing impurities or differing concentrations of impurities, discrete physical boundaries between different regions may not actually exist in the completed device but instead regions may transition from one to another. Some boundaries as shown in the accompanying figures are of this type and are illustrated as abrupt structures merely for the assistance of the reader.

As discussed above, CMOS, BiCMOS, or BiDMOS devices may be configured to operate at input/output voltages that are a fraction of the power supply source voltage. According to some implementations, a single structure protection device that is formed on the same substrate and is capable of tolerating high voltage while maintaining isolation to the substrate for low voltage communication interface pads or pins is disclosed. The protection device is capable of providing a full built-in discharge path to the different power rails on a circuit. The protection device also provides dual-tub isolation between voltage terminals coupled to the circuit and the substrate.

FIG. 1 is a schematic block diagram of an example of a protection device 100 and a circuit 105 according to some implementations. As shown in FIG. 1, the protection device 100 is coupled in parallel between the circuit 105 and voltage terminals 104, 106, 108, and 110. The circuit 105 may be provided on a circuit board that includes connections to high voltage power rails having a range of, for example, about −50V to about +50V. For example, a substrate of the circuit 105 may be coupled to a high voltage negative power supply terminal 108 having a voltage of HV $V_{SS}$. The voltage terminals 104, 106, and 110 can be configured to provide voltage levels that are a fraction of the voltages that are provided through the high voltage power rails, which may be coupled to other circuits on the same substrate. For example, as shown in FIG. 1, the circuit 105 is coupled to a low voltage positive power supply terminal 104 having a voltage level LV $V_{DD}$, and a low voltage negative power supply terminal 110 having a voltage level LV $V_{SS}$. The circuit 105 is also coupled to a bi-directional low voltage input/output (IO) terminal 106 that has a voltage level equal to LV $V_{IO}$. For example, the HV $V_{SS}$ voltage may be equal to about −50V, the LV $V_{DD}$ voltage may be equal to about +5V, the LV $V_{SS}$ voltage may be equal to about −5V, and the LV $V_{IO}$ voltage may vary within a voltage operating window of, for example, about 0V to about 5V. Other voltage levels may also be used, for instance the LV $V_{DD}$ voltage may be equal to about +5V, and for the LV $V_{SS}$ voltage may be equal to references 0V. In some implementations, the voltage levels LV $V_{SS}$, HV $V_{SS}$, LV $V_{DD}$, and LV $V_{IO}$ may also be provided within a range of voltages having the same polarity.

As shown in FIG. 1, the protection device 100 is coupled in parallel between the voltage terminals 104, 106, 108, 110 and the circuit 105. As will be discussed in greater detail below, the protection device 100 is configured to provide ESD protection for the circuit 105 and isolation of the voltage terminals 104, 106, 108, and 110.

Figure 2A:
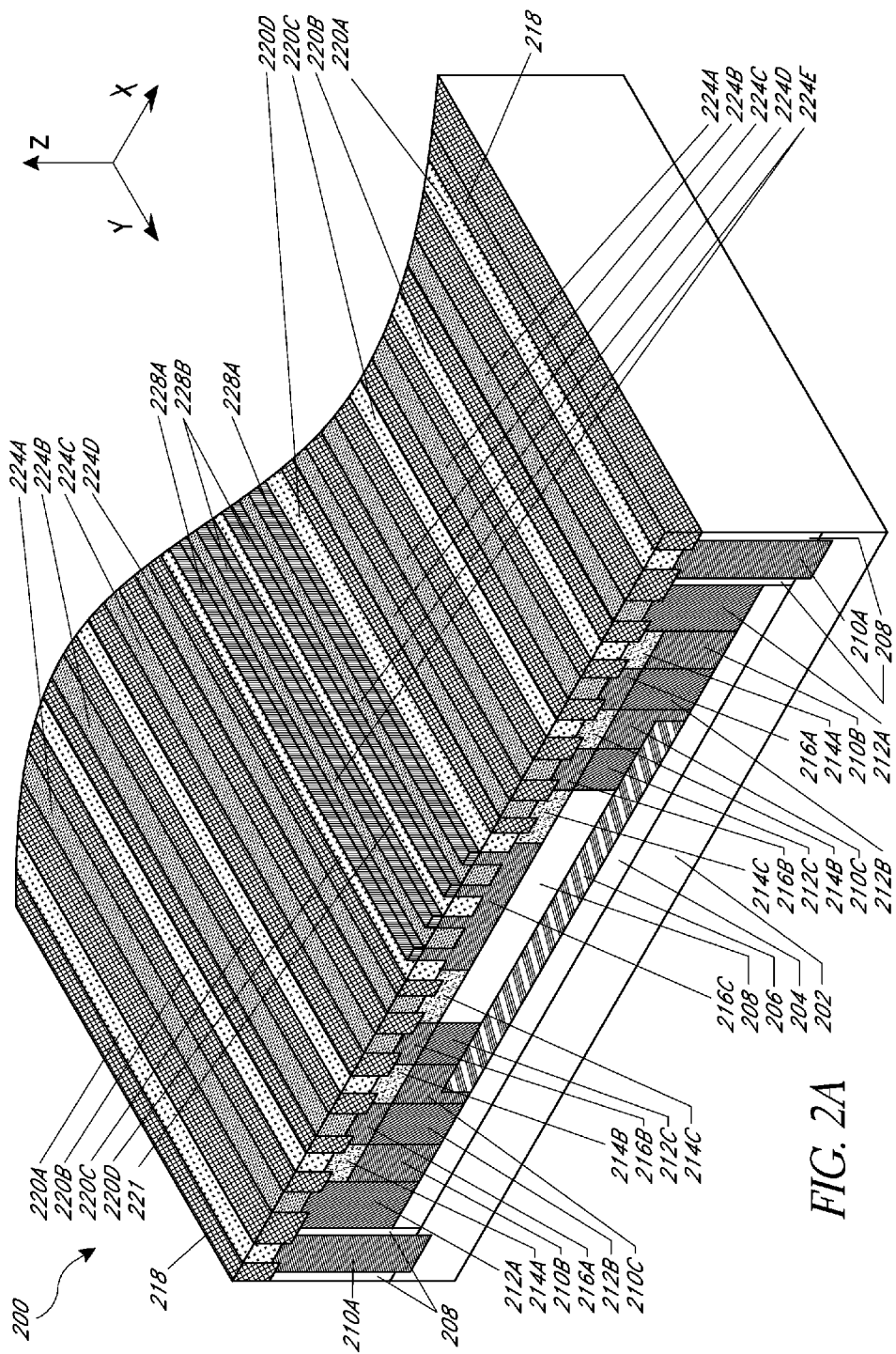
FIG. 2A is a perspective view of a high voltage-isolated/low voltage communication interface protection device according to some implementations.
Figure 2B:
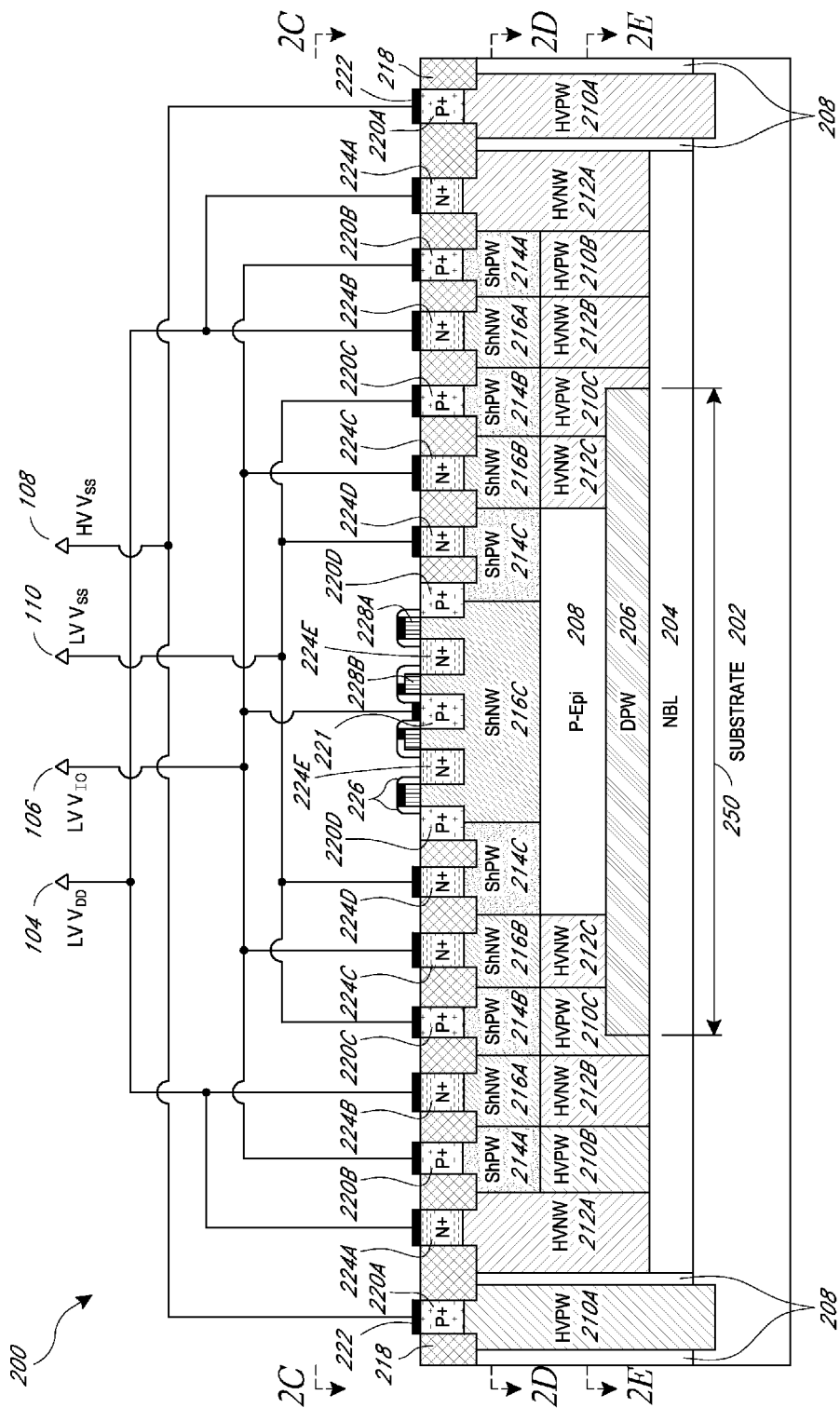
FIG. 2B is a cross-section view along a ZX plane of the protection device of FIG. 2A.

FIGS. 2A-2D illustrate a protection device 200 according to some implementations. FIG. 2A is a perspective view of the protection device 200. FIG. 2B is a cross-section view of the protection device 200 along a Z-X plane of FIG. 2A.

As shown in FIGS. 2A and 2B, the protection device 200 includes a substrate 202 including a semiconductor material (such as silicon). For application in the range of 30 V to about 100 V, for instance 60V, the substrate 202 can have a doping concentration from about $7\times10^{14}$ atoms/cm$^3$ to about $1\times10^{16}$ atoms/cm$^3$, for example about $1\times10^{15}$ atoms/cm$^3$, and a thickness within a range of about 80 μm to about 150 μm, for example about 100 μm. As shown in the illustrative embodiment of FIG. 2B, the substrate 202 has a p-type doping concentration. A p-type epitaxial layer (P-Epi) 208 is disposed on the substrate 202. The p-type epitaxial layer 208 may be grown over the substrate 202 and may have a p-type doping concentration in the range of about $5\times10^{13}$ atoms/cm$^3$ to about $4\times10^{14}$ atoms/cm$^3$, for example about $1\times10^{14}$ atoms/cm$^3$, and a thickness within a range of about 4.0 μm to about 6.5 μm, for example about 5.0 μm. Other applicable doping concentrations and thicknesses will be readily determined by one of ordinary skill in the art. While shown as discrete sections and/or layers, the various wells, regions, and layers described and illustrated in FIGS. 2A-2D may be formed by doping the p-type epitaxial layer 208 to different doping concentrations and conductivity types in different sections of the p-type epitaxial layer 208. For example, n-type regions may be formed in the p-type epitaxial layer 208 by doping the p-type epitaxial layer 208 with a negative dopant (for example, group V atoms such as phosphorus or arsenic atoms), and p-type regions having a higher doping concentration than the doping concentration of the p-type epitaxial layer 208 may be formed by doping the p-type epitaxial layer 208 with a positive dopant (for example, group III atoms such as boron atoms).

The doping depth of the various regions will be described with reference to the top surface of the protection device 200 in the Z direction as shown in FIG. 2A. As shown in FIG. 2A and FIG. 2B, an n-type buried layer (NBL) 204 is disposed on the substrate 202. The n-type buried layer 204 may have an n-type peak doping concentration in the range of about $9\times10^{16}$ atoms/cm$^3$ to about $1\times10^{18}$ atoms/cm$^3$, for example about $2\times10^{17}$ atoms/cm$^3$, and the depth of the doping peak may be within a range of about 4 μm to about 6 μm, for example about 4.5 μm, from the top surface of the protection device 200. Other applicable doping concentrations and doping depth will be readily determined by one of ordinary skill in the art. In one embodiments, the doping concentration of the n-type buried layer 204 may be set to minimize the parasitic effect of parasitic devices formed by the interfaces along a vertical path from the terminals 104, 106, and 110 to the substrate 202 of the protection device 200. A deep p-type well (DPW) 206 is disposed on the n-type buried layer 204. The deep p-type well 206 may have a p-type doping peak concentration in the range of about $8.5\times10^{16}$ atoms/cm$^3$ to about $2.5\times10^{17}$ atoms/cm$^3$, for example about $1\times10^{17}$ atoms/cm$^3$, and a doping peak depth within a range of about 1.5 μm to about 2.5 µm, for example about 2 µm, away from the top surface of the protection device 200. Other applicable doping concentrations and thicknesses will be readily determined by one of ordinary skill in the art. The deep p-type well 206, along with the n-type buried layer 204, are configured to provide isolation along a vertical path between the terminals 104, 106, and 110 and the substrate 202. The n-type buried layer 204 also provides a variation in the conductivity type between the p-type substrate 202 and the p-type epitaxial layer 208. Due to this variation and separation of the p-type layers, the parasitic devices formed by the structures of the protection device 200 exhibit lower gain.

As illustrated in FIG. 2B, the deep p-type well 206 has a width 250 along a surface of the n-type buried layer 204, which corresponds proportionally to an effective resistance of the deep p-type well 206. As will be discussed in greater detail later with reference to FIG. 8, the width 250 of the deep p-type well 206 may be set to control the resistance of the base of an embedded NPN bipolar transistor in the protection device. The p-type epitaxial layer 208 is lightly doped relative to the other regions of the protection device 200. The deep p-type well 206 has a peak doping concentration (for example, $1 \times 10^{17}$ atoms/cm$^3$) that is slightly higher than the doping concentration of the p-type epitaxial layer 208 (for example, $1 \times 10^{14}$ atoms/cm$^3$), thereby facilitating the formation of a high resistance of the base of the NPN bipolar transistor.

Alternating high-voltage p-type wells (HVPW) 210A-210C and high-voltage n-type wells (HVNW) 212A-212C are also provided over the substrate 202. The high-voltage p-type wells 210A-210C may have a p-type doping concentration in the range of about $1.5 \times 10^{16}$ atoms/cm$^3$ to about $1.0 \times 10^{17}$ atoms/cm$^3$, for example about $2.5 \times 10^{16}$ atoms/cm$^3$, a peak doping concentration close to the top surface of the protection device 200 and a diffusion depth from the top surface of the protection device 200 within a range of about 3.0 µm to about 5 µm, for example about 4 µm. The high-voltage n-type wells 212A-212C may have an n-type doping concentration in the range of about $5 \times 10^{16}$ atoms/cm$^3$ to about $1.0 \times 10^{17}$ atoms/cm$^3$, for example about $3.0 \times 10^{16}$ atoms/cm$^3$, a peak doping concentration close to the top surface of the protection device 200 and a diffusion depth from the top surface of the protection device 200 within a range of about 3.0 µm to about 5 µm, for example about 4 µm. Other applicable doping concentrations and thicknesses will be readily determined by one of ordinary skill in the art. As shown in FIG. 2A and FIG. 2B, high voltage p-type well (HVPW) 210A is disposed on the substrate 202 and is at least partially embedded in the substrate 202. The high voltage p-type well 210A is separated from the high voltage n-type well 212A by a region of the p-type epitaxial layer 208. The high-voltage n-type well 212A is disposed on the n-type buried layer 204. As shown in FIG. 2A and FIG. 2B, each of the high voltage p-type well 210B and high voltage n-type well 212B are disposed on the n-type buried layer 204. High voltage n-type well 212C is formed at least partially over the deep p-type well 206, and at least partially over the n-type buried layer 204. The interface between high-voltage wells 212A, 210B, 212B, 210C, and 212C provides a metallurgical junction which blocks current during normal operation as will be discussed in greater detail below.

As shown in FIG. 2A and FIG. 2B, shallow wells 214A, 216A, 214B, and 216B of alternating conductivity type are disposed on high-voltage wells 210B, 212B, 210C, and 212C respectively. The high voltage wells 210B, 212B, 210C, and 212C reduce the resistance and improve conductivity between the shallow wells 214A, 216A, 214B, 216B and the n-type buried layer 204 or the deep p-type well 206. A p-type shallow well 214C is disposed on the p-type epitaxial layer 208. An n-type shallow well 216C is also disposed on the p-type epitaxial layer 208. The p-type shallow wells (ShPW) 214A, 214B, and 214C have a peak p-type doping concentration close to the surface in the range of about $5.0 \times 10^{17}$ atoms/cm$^3$ to about $1.0 \times 10^{18}$ atoms/cm$^3$, for example about $8 \times 10^{17}$ atoms/cm$^3$, and have a diffusion depth away from the top surface of the protection device 200 in the range of about 0.5 µm to about 1.5 µm, for example about 0.8 µm. The n-type shallow wells (ShNW) 216A, 216B, and 216C have a peak n-type doping concentration close to the surface in the range of about $1.5 \times 10^{17}$ atoms/cm$^3$ to about $8 \times 10^{17}$ atoms/cm$^3$, for example about $2.5 \times 10^{17}$ atoms/cm$^3$, and have a diffusion depth away from the top surface of the protection device 200 in the range of about 0.5 µm to about 1.5 µm, for example about 0.75 µm. Other applicable doping concentrations and thicknesses will be readily determined by one of ordinary skill in the art.

A p-type active region (P+) 220A and an n-type active region (N+) 224A are disposed on the high-voltage p-type well 210A and the high-voltage n-type well 212A respectively. P-type active regions 220B, 220C and n-type active regions 224b, 224C are disposed on corresponding p-type shallow wells 214A, 214B and n-type shallow wells 216A, 216B as shown in FIGS. 2A and 2B. An n-type active region 224D is disposed on the n-type shallow well 214C. A p-type active region 220D is formed at least partially over the p-type shallow well 214C and partially over the n-type shallow well 216C. The active regions 220A, 224A, 220B, 224B, 220C, 224C, 224D, and 220D are separated from one another by shallow trench isolation (STI) regions 218. The shallow trench isolation regions 218 may include a dielectric material, such as silicon dioxide, or the like.

An n-type active region 224E is disposed on the n-type shallow well 216C. A p-type active region 221 is also disposed on the n-type shallow well 216C. The n-type active region 224E is configured to function as an isolation region in order to block hole carrier leakage that can occur between the p-type active region 221 and p-type active region 220D, thereby avoiding the formation of a floating gate P-type mosfet device between these two regions. The p-type active region 220D, the n-type active region 224E, and the p-type active region 221 are separated by portions of the n-type shallow well 216C. The p-type active regions 220A-220D, 221 may have a peak p-type doping concentration close to surface in the range of about $1 \times 10^{20}$ atoms/cm$^3$ to about $8 \times 10^{20}$ atoms/cm$^3$, for example about $2 \times 10^{20}$ atoms/cm$^3$ and a narrow diffusion depth of about 0.3 µm. The n-type active regions 224A-224E may have an n-type peak doping concentration in the range of $1 \times 10^{20}$ atoms/cm$^3$ to about $8 \times 10^{20}$ atoms/cm$^3$, for example about $5 \times 10^{20}$ atoms/cm$^3$ and a narrow diffusion depth of about 0.3 µm. Other applicable doping concentrations will be readily determined by one of ordinary skill in the art.

As shown in FIG. 2B, a highly conductive material layer 222 is disposed on the p-type active regions 220A-220C, 221 and over the n-type active regions 224A-224D. The highly conductive material layer 222 may include a material such as silicide, or the like. The highly conductive material layer 222 is configured to provide a conductive connection path to corresponding terminals of the protection device 200, and to enhance conductivity within each of the active regions. As shown in FIG. 2B, the highly conductive material layer 222 is not disposed over the p-type active region 220D or the n-type active region 224E. In some implementations, the highly conductive material layer 222 may be provided over the p-type active region 220D and/or the n-type active region 224E to enable external trigger control of the device (e.g., by utilizing an external current source).

With reference to FIG. 2B, the protection device 200 is coupled to terminals 104, 106, 108, and 110 having corresponding voltage levels LV $V_{DD}$, LV $V_{IO}$, HV $V_{SS}$, and LV $V_{SS}$, respectively, as discussed above with reference to FIG. 1. As shown in FIG. 2B, the high voltage negative power supply terminal 108 is coupled to the p-type active region 220A. The low voltage positive power supply terminal 104 is coupled to the n-type active regions 224A and 224B. The bi-directional low voltage input/output (IO) terminal 106 is coupled to the p-type active regions 220B and 221, and to the n-type active region 224C. The low voltage negative power supply terminal 110 is coupled to the p-type active region 220C and the n-type active region 224D.

The protection device 200 includes a plurality of interfaces of different conductivity type which form a plurality of electrical components. For example, the central region of the protection device 200 above the p-type epitaxial layer 208 may be referred to as thyristor region of the protection device 200. The thyristor region includes NPNP interfaces corresponding to n-type active region 224D, p-type shallow well region 214C, n-type shallow well region 216C, and p-type active region 221, respectively, which effectively form an equivalent thyristor having a gate, anode, and cathode. The n-type shallow well region 216C and the p-type active region 221 correspond to the anode of the equivalent thyristor, the p-type active region 220D corresponds to the gate of the equivalent thyristor, and the n-type active region 224D corresponds to the cathode of the equivalent thyristor. As discussed above, the anode of the equivalent thyristor (for example, n-type shallow well region 216C and p-type active region 221) is coupled to the bi-directional low-voltage input/out terminal 106, while the cathode of the equivalent thyristor is coupled to the low voltage negative power supply terminal 110. The gate of the equivalent thyristor (for example, p-type active region 220D) is configured to be floating as shown in FIG. 2B. That is, the p-type active region 220D is not connected to a voltage or current source. The floating gate structure enables a reduced response time and lower breakdown voltage of the equivalent thyristor. The trigger voltage of the equivalent thyristor for the protection device 200 may be varied based on control of the connections to and conduction between the active regions that are formed above the n-type shallow well region 216C and the p-type active region 220D which functions as a gate of the equivalent thyristor. An open circuit, as shown in FIG. 2B, will result in a low breakdown voltage for a particular protection device, while a gate region short circuited to p-type active region 221 in FIG. 2B will result in a higher breakdown voltage for the particular protection device. In some implementations, the trigger voltage can be controlled by utilizing an external current or voltage source, such as a transient trigger/control current source, which is activated by a specific transient condition (e.g., a change in voltage over time (dV/dt) that exceeds a predetermined value). For example, an external current source (not shown) may be coupled to the n-type active region 220D, and may be configured to inject current to or source current from the effective gate of the thyristor to control the trigger voltage of the effective thyristor.

As illustrated in FIG. 2B, the equivalent thyristor of the protection device 200 may have a breakdown voltage in the range of about 3.0 V to about 12.0 V and a response time to a transient event of in the range of about 1.5 ns to about 4.5 ns. As will be discussed in greater detail with reference to FIGS. 8 and 9A below, the equivalent thyristor is configured to block current at operating voltages, and to shunt currents at excess voltages. For example, the equivalent thyristor is configured to block current for an operating voltage range corresponding the bi-directional low voltage input/output (10) terminal 106 and to shunt current for voltages that exceed the operating voltage of the bi-directional low voltage input/output (IO) terminal 106.

As shown in FIG. 2B, a first blocking region 228A may be disposed on the n-type shallow well 216C in an area between the p-type active region 220D and the n-type active region 224E. A second blocking region 228B may be disposed on the n-type shallow well region 216C in an area between the n-type active region 224E and the p-type active region 221. The first and second blocking regions 228A, 228B may be formed of a polysilicon material and may be configured to provide isolation between the corresponding active regions that are disposed on the n-type shallow well region 216C, thereby improving the response time of the protection device 200. For example, the first and second blocking regions 228A, 228B are configured to further block hole carrier leakage that can occur between p-type active region 221 and p-type active region 220D. As shown in FIG. 2B, a conductive material layer 222 is disposed on the first blocking region 228A and at least partially over the second blocking region 228B. The conductive material layers 222 that are disposed on the first and second blocking regions 228A, 228B, are separated from other conductive material layers 222 formed in adjacent regions by an isolation layer 226 as shown in FIG. 2B. The isolating layer 226 may be formed of an oxide having a high dielectric constant.

The direction of current and isolation/decoupling between the voltage terminals 104, 106, 108, and 110 is controlled based on the interface regions having doping concentrations of different conductivity type, which provide a metallurgical junction configured to block current during normal operation. The interfaces may correspond to partially contacting regions having doping concentration of different conductivity type. For ease of description, some of the functionality of the device may be described to behave similar to diodes having an anode region corresponding to a p-type doped region and a cathode region corresponding to an n-type doped region. For example, isolation and direction of current flow between the low voltage negative power supply terminal 110 and the bi-directional low voltage input/output (IO) terminal 106 may be controlled based at least in part on the interface between the high voltage p-type well 210C (equivalent diode anode) and the high voltage n-type well 212C (equivalent diode cathode). Isolation and direction of current flow between the low voltage positive power supply terminal 104 and the bi-directional low voltage input/output (IO) terminal 106 may be provided based at least in part on the interface between the high voltage p-type well 210B (equivalent diode anode) and the high voltage n-type well 212B (equivalent diode cathode). Isolation and direction of current flow between the low voltage negative power supply terminal 110 and the low voltage positive power supply terminal 104 may be provided based at least in part on the interface between the high voltage p-type well 210C (equivalent diode anode) and the high voltage n-type well 212B (equivalent diode cathode). Isolation and direction of current flow between the high voltage negative power supply terminal 108 and the low voltage positive power supply terminal 104 may be provided based at least in part on the interface between the combination of the high voltage p-type well 210A and the p-type epitaxial layer 208 (equivalent diode anode) and the high voltage n-type well 212A (equivalent diode cathode). The width of the protection device 200 in the Y direction can be set to handle different levels of current for different design requirements. In some implementations, the width of the protection device (e.g., protection device 200) can be within a range of about 25 μm to about 100 μm in the Y direction. For example, the width of the protection device may be about 50 μm for 6 Amps of TLP current handling capability for a single finger protection device formed as shown in FIGS. 2A and 2B. The TLP may be defined by a stress condition of 2 ns rise time and 100 ns pulse width. For example, a protection device having a width of 30 μm may be capable of withstanding a 2000 V human-body model (HBM) ESD stress condition. Similarly, variation in the width of the protection devices illustrated in FIGS. 3-7 may also be set for different design requirements.

Figure 2C:
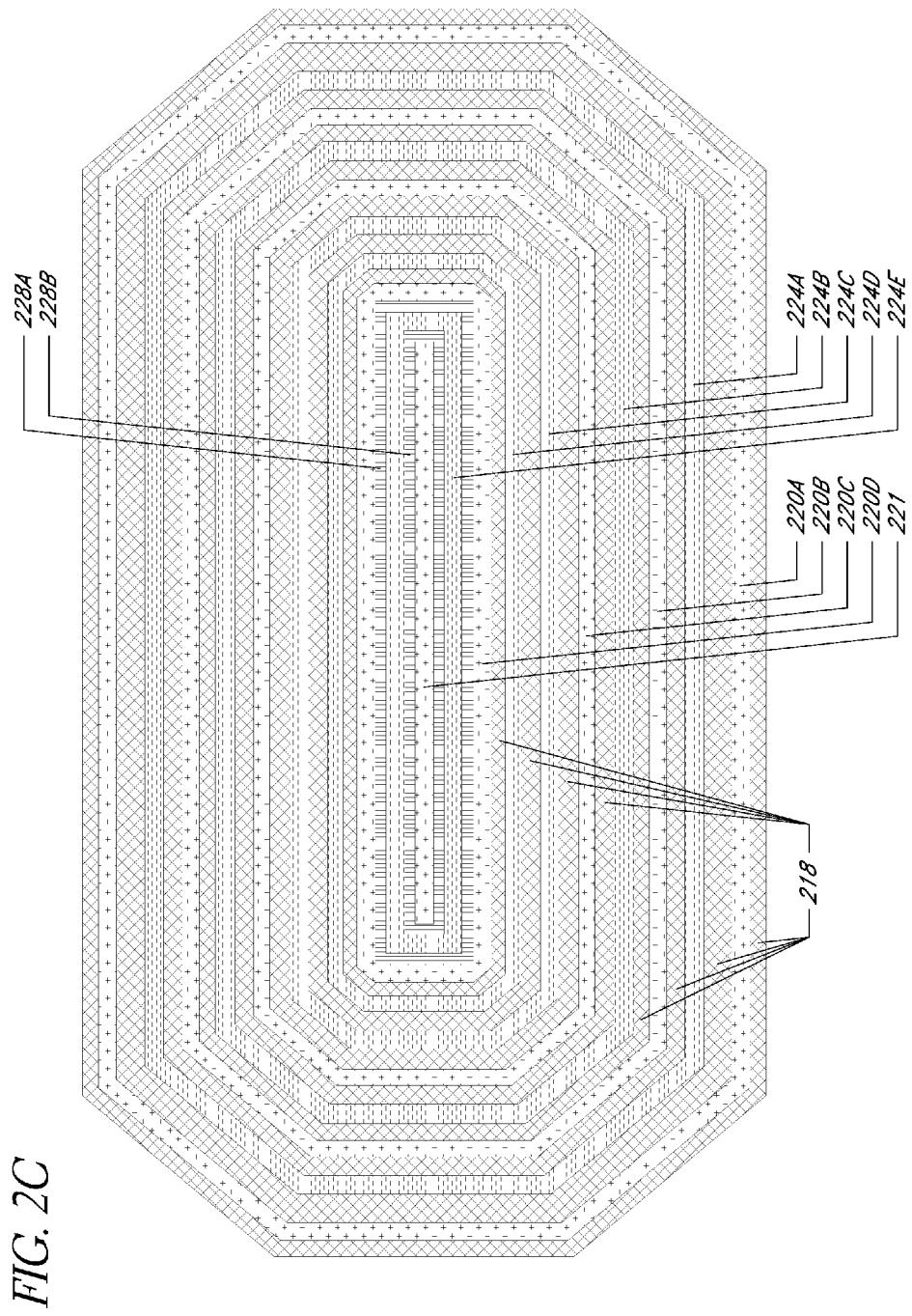
FIG. 2C is a top view of the protection device region below line 2C-2C of FIG. 2B.
Figure 2D:
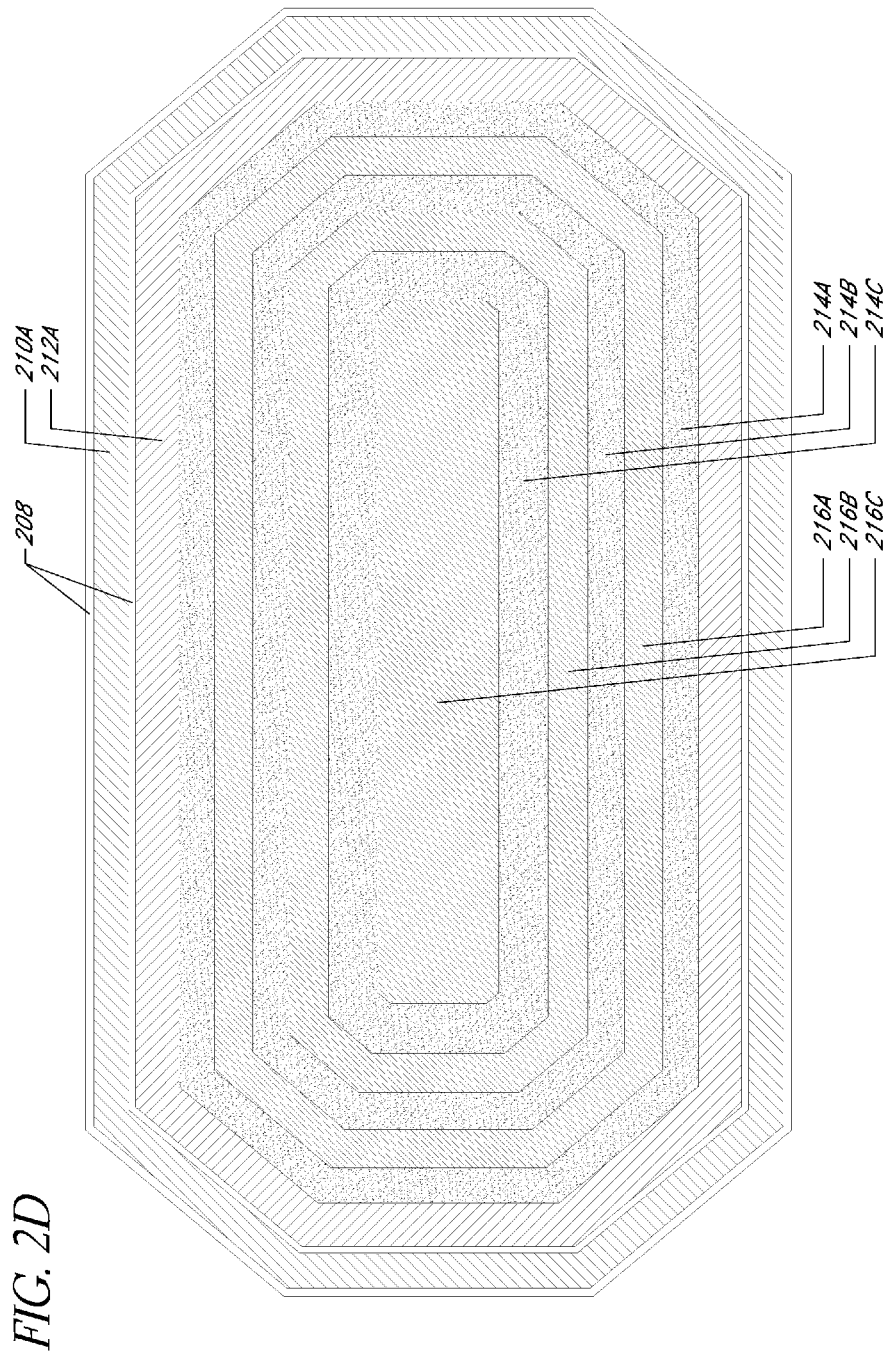
FIG. 2D is a top view of the protection device region below line 2D-2D of FIG. 2B.
Figure 2E:
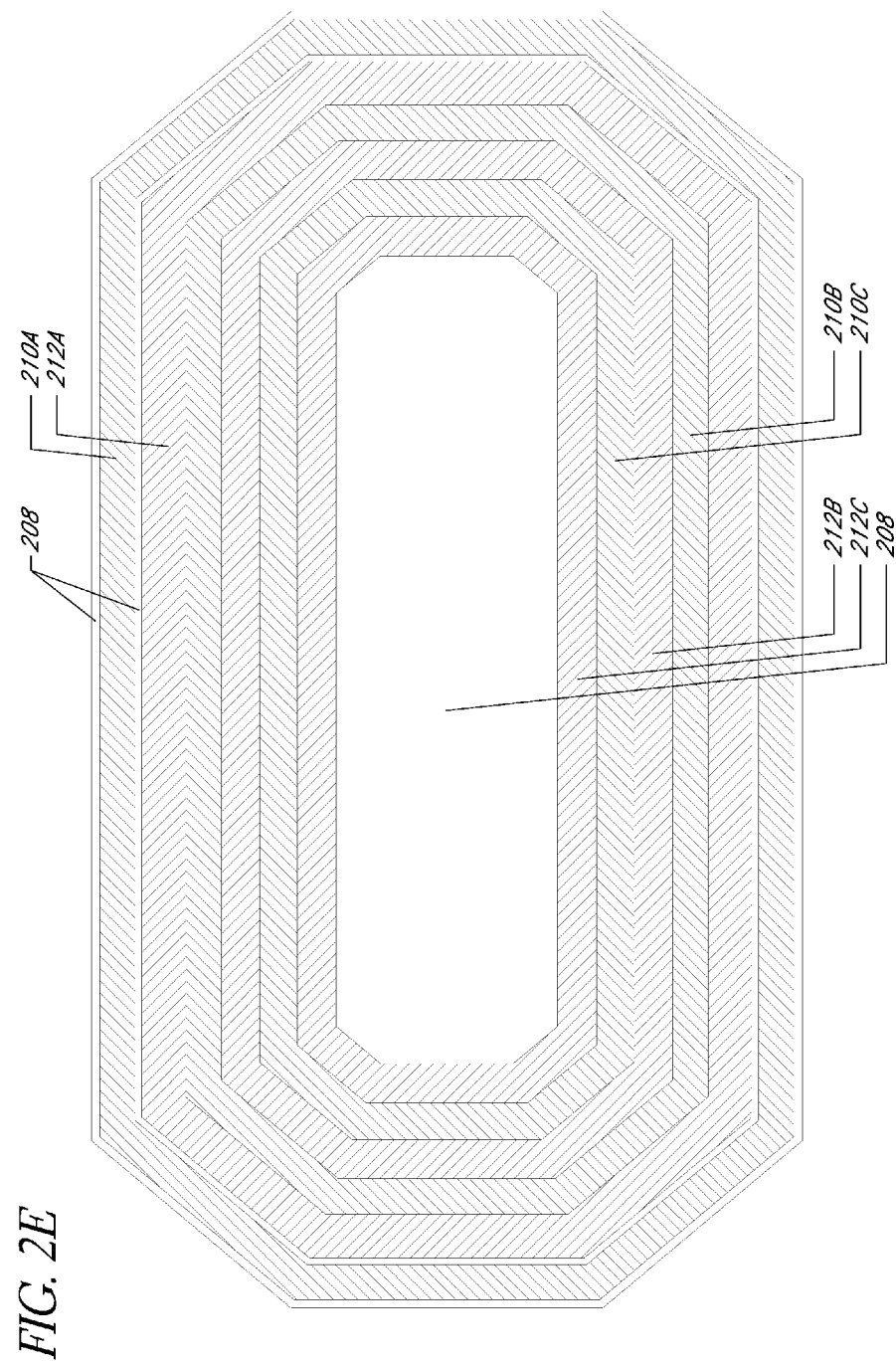
FIG. 2E is a top view of the protection device region below line 2E-2E of FIG. 2B.

FIG. 2C is a top view of one embodiment of the protection device 200 along horizontal line 2C-2C of FIG. 2B. For ease of illustration, FIG. 2C does not include the highly conductive regions 222 and the oxide isolation regions 226 discussed above with reference to FIG. 2B. FIG. 2D is a top view of the protection device 200 along horizontal line 2D-2D of FIG. 2B. As shown in FIGS. 2C and 2D, each of the illustrated regions with the exception of the central p-type active region 221 is formed as an annular region. It will be understood that in practical embodiments, the lines of FIGS. 2C and 2D can be straight or curved and do not need to be parallel. In addition, the corners of each of the regions can be rounded.

Figure 3:
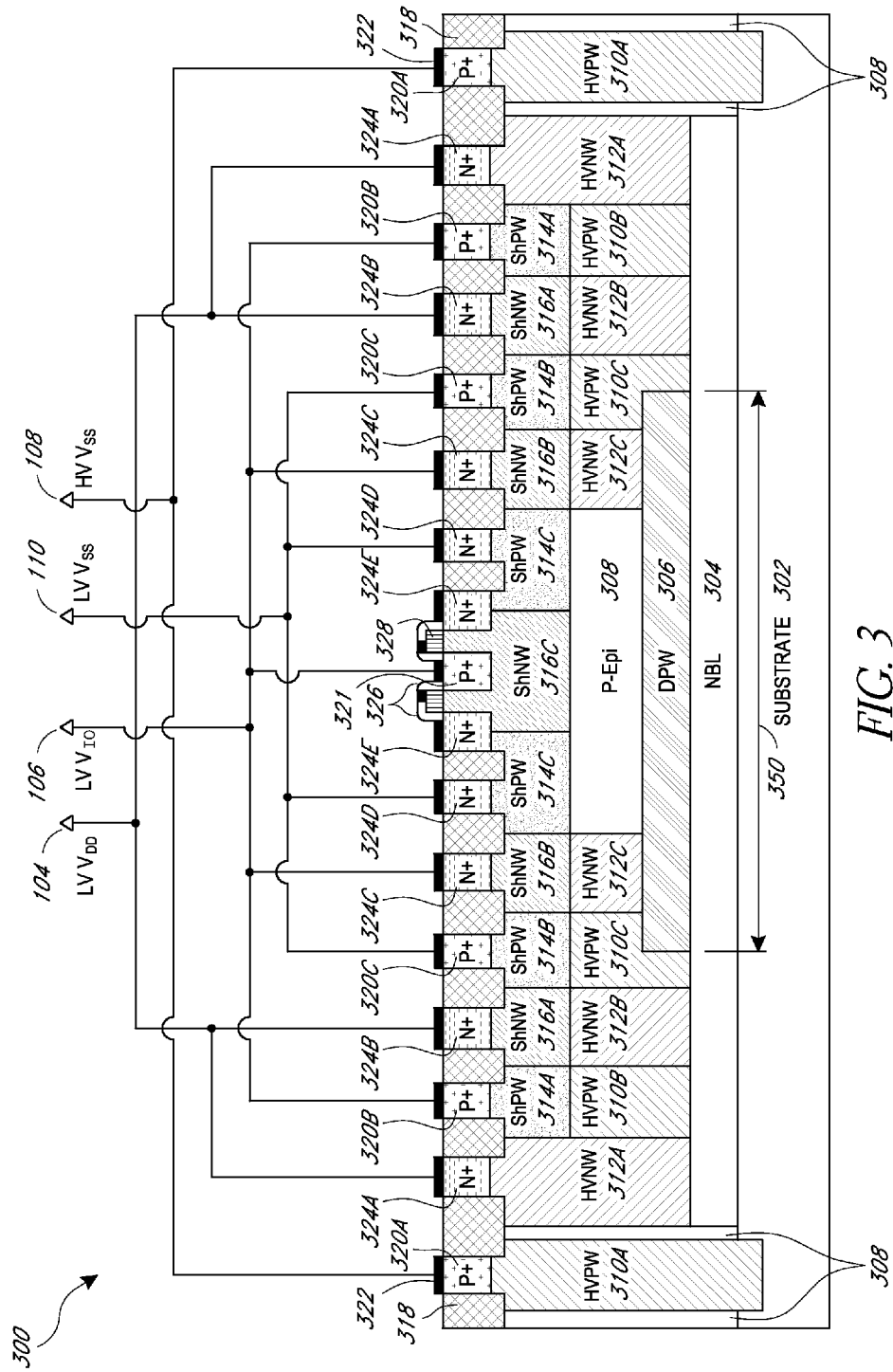
FIG. 3 is a cross-section view of a protection device according to some implementations.

FIG. 3 is a cross-section view of a protection device 300 according to some implementations. The protection device 300 is an example of the protection device 100 discussed above with reference to FIG. 1. The substrate 302, n-type buried layer 304, the deep well region 306, the p-type epitaxial layer 308, and the regions 310A-310C, 312A-312C, 314A-314C, 316A-316C, 318, 320A-320C, 321, 322, 324A-324D, 326, and 328 may be similar to the substrate 202, n-type buried layer 204, the deep p-type well 206, the p-type epitaxial layer 208, and the regions 210A-210C, 212A-212C, 214A-214C, 216A-216C, 218, 220A-220C, 221, 222, 224A-224D, 226, and 228A-228B discussed above with reference to FIG. 2B. As shown in FIG. 3, the protection device 300 includes a variation in the structure of the equivalent thyristor region relative to the structure described above with reference to FIG. 2B. The equivalent thyristor region of the protection device 300 includes an n-type shallow well region 316C similar to the n-type shallow well region 216C. However, unlike the equivalent thyristor region of the protection device 200, the thyristor region of the protection device 300 does not include p-type active regions between the p-type active region 321 and the n-type active region 324D. Rather, the protection device 300 includes an n-type active region 324E that is formed partially over the n-type shallow well region 316C between the p-type active region 321 and the n-type active region 324D. The n-type active region 324E includes the highly conductive material layer 322 formed thereon. An blocking region 328 is disposed on the n-type shallow well region 316C and includes the highly conductive material layer 322 and isolation layer 318 as shown in FIG. 3. The blocking region 328 is configured to isolate the n-type active region 324E from the p-type active region 321. The variation in the structure of the thyristor region for the protection device 300 relative to the protection device 200 provides variation in the breakdown voltage of the equivalent thyristor. The breakdown voltage of the equivalent thyristor of protection device 300 may be in the range of about 2.5 V to about 10.5 V for example about 8 V, while maintaining a response time in the range of about 1.5 ns to about 4 ns, for example about 1.8 ns.

Figure 4:
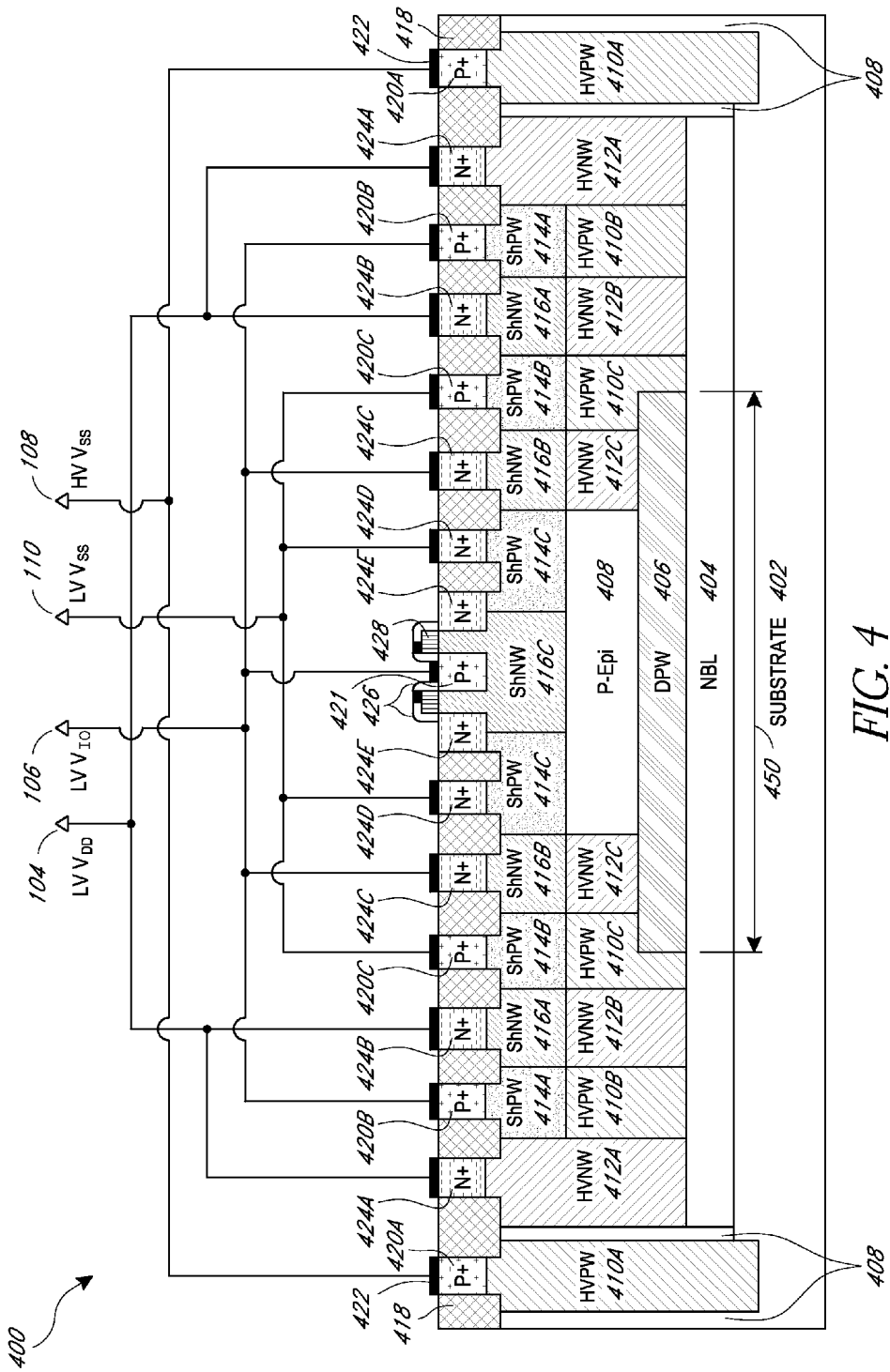
FIG. 4 is a cross-section view of a protection device according to some implementations.

FIG. 4 is a cross-section view of a protection device 400 according to some implementations. The protection device 400 is an example of the protection device 100 discussed above with reference to FIG. 1. The substrate 402, n-type buried layer 404, the deep well region 406, the p-type epitaxial layer 408, and the regions 410A-410C, 412A-412C, 414A-414C, 416A-416C, 418, 420A-420C, 421, 422, 424A-424D, 426, and 428 may be similar to the substrate 202, n-type buried layer 204, the deep p-type well 206, the p-type epitaxial layer 208, and the regions 210A-210C, 212A-212C, 214A-214C, 216A-216C, 218, 220A-220C, 221, 222, 224A-224D, 226, and 228A-228B discussed above with reference to FIG. 2B. As shown in FIG. 4, the protection device 400 includes a variation in the structure of the equivalent thyristor region relative to the structure described above with reference to FIG. 2B and FIG. 3. The protection device 400 is similar to the protection device 300 discussed above with reference to FIG. 3, with the variation to the n-type active region 424E relative to the n-type active region 324E. As shown in FIG. 4, the n-type active region 424E does not include the highly conductive material layer 426 formed thereon. As a result, the equivalent thyristor of protection device 400 exhibits a higher breakdown voltage than the equivalent thyristor of protection device 300. The variation in the structure of the region for the protection device 400 relative to the protection devices 200 and 300 provides variation in the breakdown voltage of equivalent thyristor. The breakdown voltage of the equivalent thyristor of protection device 400 may be in the range of 2.5 V to about 10.5 V for example about 8 V, while maintaining a response time in the range of about 2 ns to about 4 ns, for example about 2.5 ns.

Figure 5:
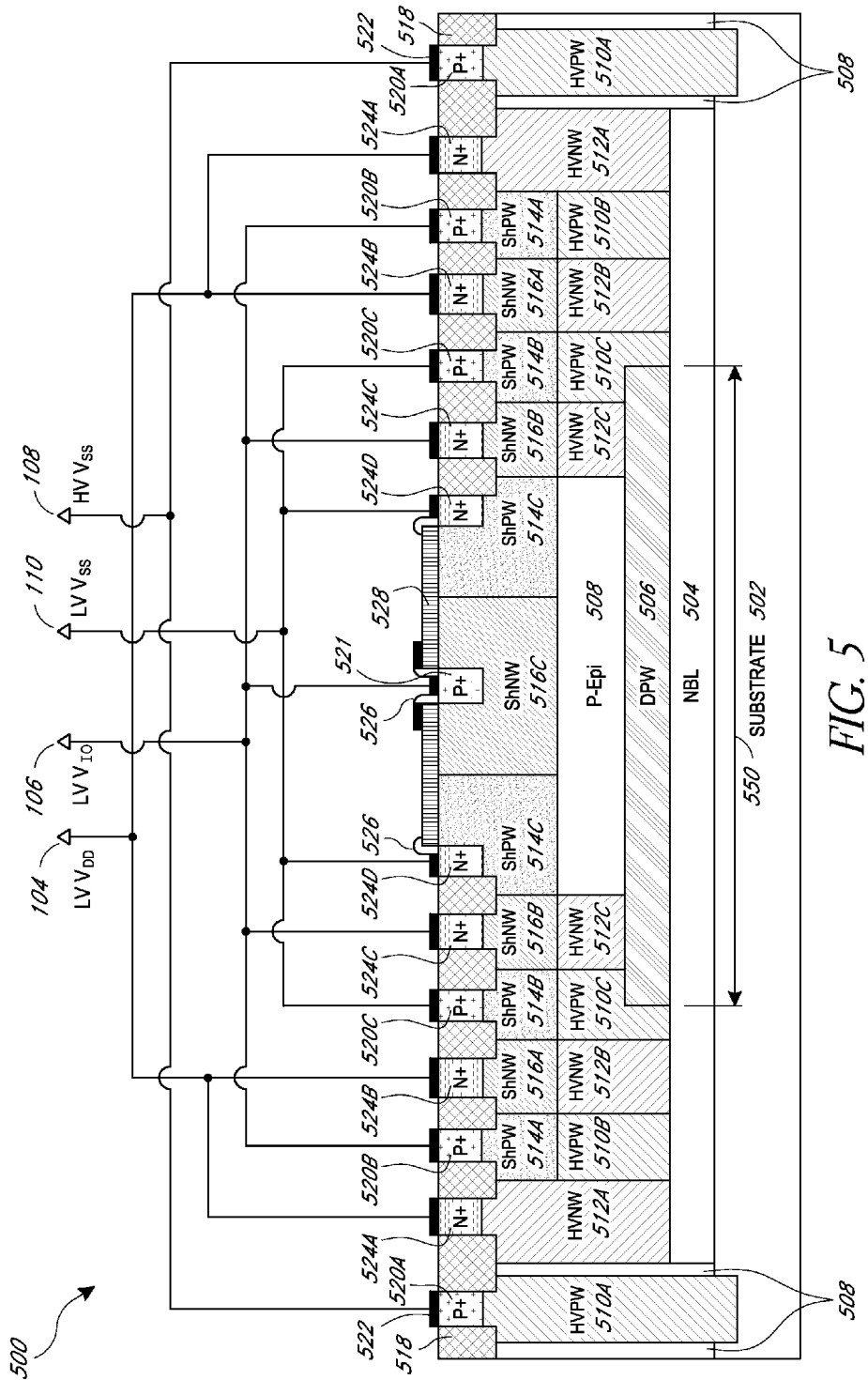
FIG. 5 is a cross-section view of a protection device according to some implementations.

FIG. 5 is a cross-section view of a protection device 500 according to some implementations. The protection device 500 is an example of the protection device 100 discussed above with reference to FIG. 1. The substrate 502, n-type buried layer 504, the deep well region 506, the p-type epitaxial layer 508, and the regions 510A-510C, 512A-512C, 514A-514C, 516A-516C, 518, 520A-520C, 521, 522, 524A-524D, 526, and 528 may be similar to the substrate 202, n-type buried layer 204, the deep p-type well 206, the p-type epitaxial layer 208, and the regions 210A-210C, 212A-212C, 214A-214C, 216A-216C, 218, 220A-220C, 221, 222, 224A-224D, 226, and 228A-228B discussed above with reference to FIG. 2B. Unlike the protection device 200, the protection device 500 does not include p-type active regions or n-type active regions in the thyristor region (for example, between the n-type active region 524D and the p-type active region 521). Rather, as shown in FIG. 5, an blocking region 528 extends in an area above the p-type shallow well region 514C and the n-type shallow well region 516C between the n-type active region 524D and the p-type active region 521. The blocking region 528 is configured to isolate the n-type active region 524D and the p-type active region 521. The variation in the structure of the thyristor region for the protection device 500 relative to the protection devices 200, 300, and 400 provides variation in the breakdown voltage of the equivalent thyristor. The breakdown voltage of the equivalent thyristor of protection device 500 may be in the range of about 2.0 V to about 14 V for example about 12 V, while maintaining a response time in the range of about 1.0 ns to about 3 ns, for example about 2.0 ns.

Figure 6:
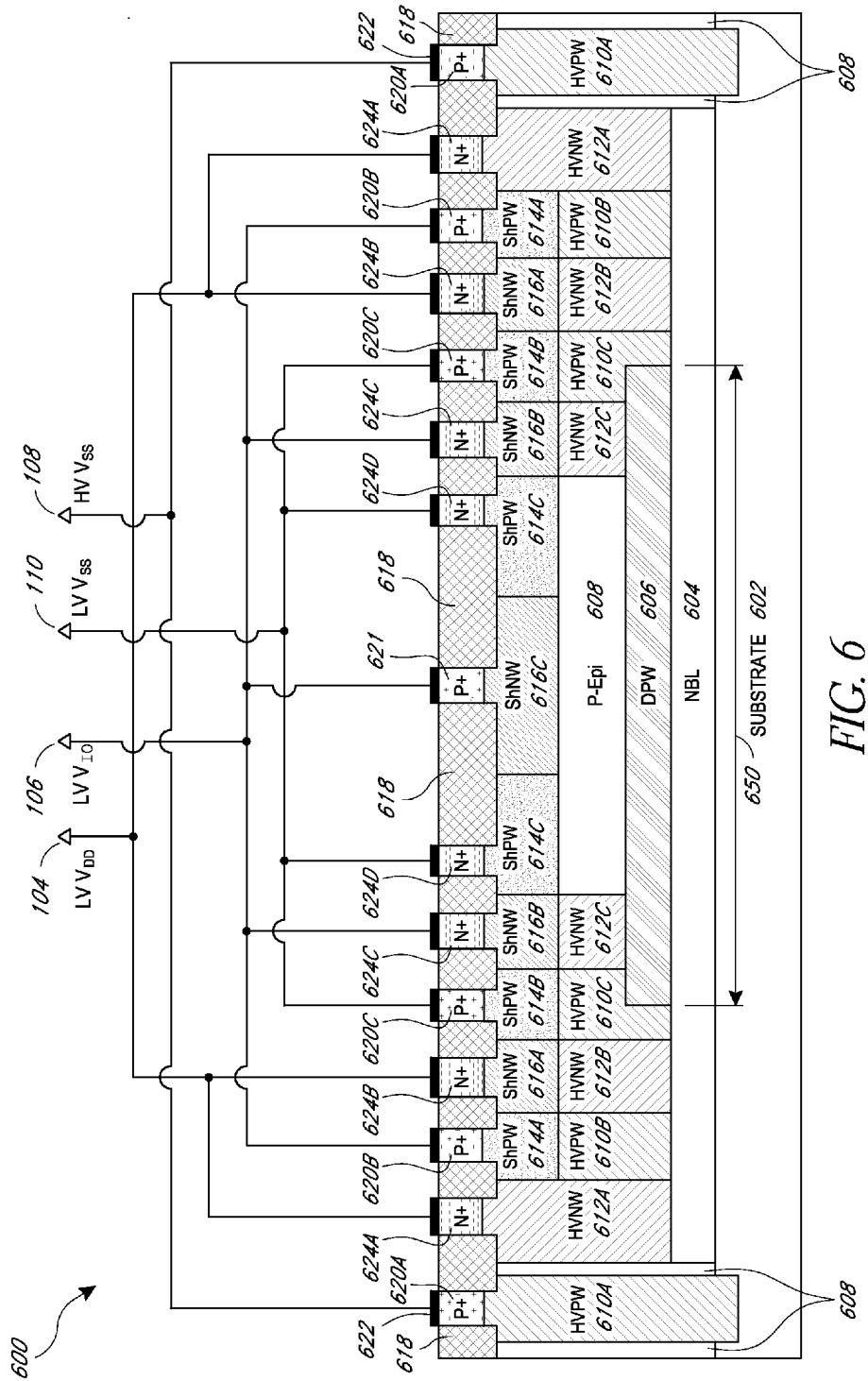
FIG. 6 is a cross-section view of a protection device according to some implementations.

FIG. 6 is a cross-section view of a protection device 600 according to some implementations. The protection device 600 is an example of the protection device 100 discussed above with reference to FIG. 1. The substrate 602, n-type buried layer 604, the deep well region 606, the p-type epitaxial layer 608, and the regions 610A-610C, 612A-612C, 614A-614C, 616A-616C, 618, 620A-620C, 621, 622, 624A-624D, 626, and 628 may be similar to the substrate 202, n-type buried layer 204, the deep p-type well 206, the p-type epitaxial layer 208, and the regions 210A-210C, 212A-212C, 214A-214C, 216A-216C, 218, 220A-220C, 221, 222, 224A-224D, 226, and 228A-228B discussed above with reference to FIG. 2B. Unlike the protection device 200, and similar to the protection device 500, the protection device 600 does not include p-type active regions or n-type active regions in the thyristor region (for example, between the n-type active region 624D and the p-type active region 621). Rather, as shown in FIG. 6, a shallow trench isolation region 618 extends in an area above the p-type shallow well region 614C and the n-type shallow well region 616C between the n-type active region 624D and the p-type active region 621. The shallow trench isolation region 618 is configured to function as a blocking and isolation region, and is configured to isolate the n-type active region 624D and the p-type active region 621. The variation in the structure of the thyristor region for the protection device 600 relative to the protection devices 200, 300, 400, and 500 provides variation in the breakdown voltage of the equivalent thyristor. The breakdown voltage of the equivalent thyristor of protection device 600 may be in the range of about 8.0 V to about 20 V for example about 15 V, while maintaining a response time in the range of about 2.0 ns to about 4.5 ns, for example about 3.0 ns.

Figure 7:
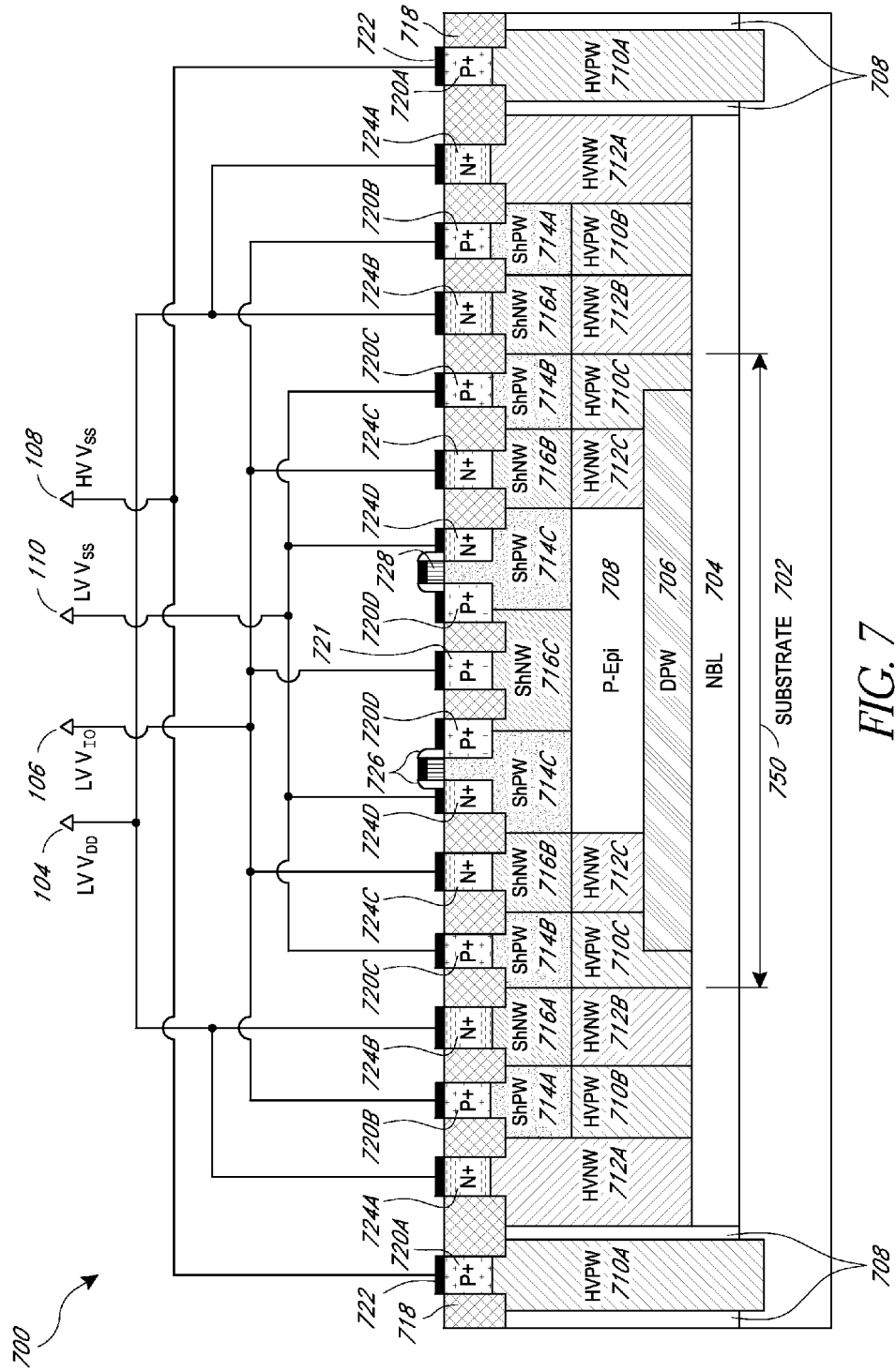
FIG. 7 is a cross-section view of a protection device according to some implementations.

FIG. 7 is a cross-section view of a protection device 700 according to some implementations. The protection device 700 is an example of the protection device 100 discussed above with reference to FIG. 1. The substrate 702, n-type buried layer 704, the deep well region 706, the p-type epitaxial layer 708, and the regions 710A-710C, 712A-712C, 714A-714C, 716A-716C, 718, 720A-720C, 721, 722, 724A-724D, 726, and 728 may be similar to the substrate 202, n-type buried layer 204, the deep p-type well 206, the p-type epitaxial layer 208, and the regions 210A-210C, 212A-212C, 214A-214C, 216A-216C, 218, 220A-220C, 221, 222, 224A-224D, 226, and 228A-228B discussed above with reference to FIG. 2B. Unlike the protection device 200, the protection device 700 does not include n-type active regions in the thyristor region (for example, between the n-type active region 724D and the p-type active region 721). Rather, as shown in FIG. 7, the thyristor region includes p-type active region 720D which is formed partially over the p-type shallow well region 724C and partially over the n-type shallow well region 716C. An blocking region 728 is disposed on the p-type shallow well region 714C and between the n-type active region 724D and p-type active region 720D. The highly conductive material layer 722 is disposed on the blocking region 728, and the isolation layer 726 is configured to isolate the highly conductive regions 722 as shown in FIG. 7. In some implementations, the highly conductive material 722 may be excluded from the p-type active regions 720D in order to reduce leakage current of the protection device 700. As shown in FIG. 7, the highly conductive material layer 722 may be provided and coupled to an external current or voltage source (not shown) in order to further control the trigger voltage of the effective thyristor of the protection device 700.

The variation in the structure of the thyristor region for the protection device 700 relative to the protection devices 200, 300, 400, 500, and 600 provides variation in the breakdown voltage of the equivalent thyristor. The breakdown voltage of the equivalent thyristor of protection device 700 may be in the range of about 3.5 V to about 13.5 V for example about 11 V, while maintaining a response time in the range of about 1.5 ns to about 4 ns, for example about 1.8 ns.

Figure 8:
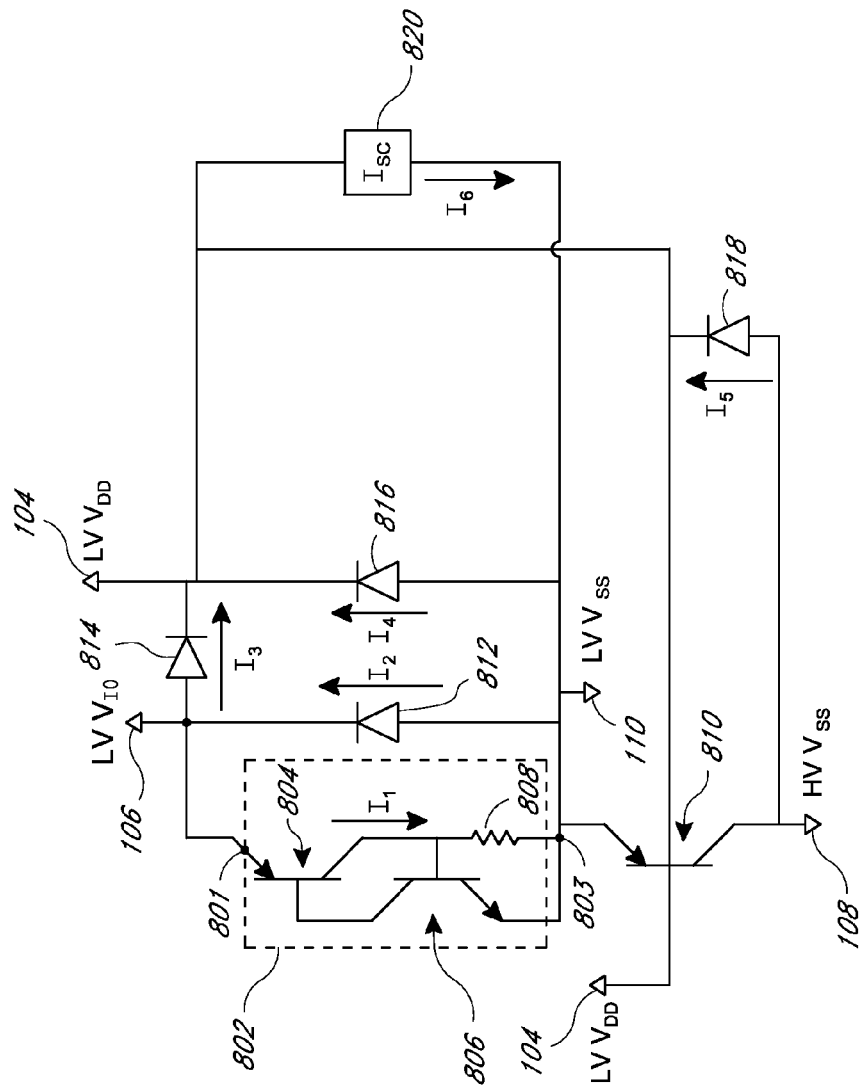
FIG. 8 shows an equivalent circuit diagram of the protection devices illustrated in FIGS. 2A-2D and 3-7.

FIG. 8 shows an equivalent circuit diagram of the protection devices 100, 200, 300, 400, 500, 600, and 700. The equivalent circuit diagram shown in FIG. 8 is illustrated only for ease of description of the operation of the protection devices discussed above, and one of ordinary skill in the art will recognize that the structures illustrated in FIGS. 2A-2D and FIGS. 3-7 do not necessarily correspond to the equivalent circuit components relied upon for the description of the functionality of the protection devices. The connections between the various nodes may correspond to conductive paths between the nodes, including through capacitive coupling. The circuit components illustrated in FIG. 8 may be discussed by referring to regions and structures of protection device 200 as examples. However, the equivalent circuit diagram shown in FIG. 8 is similarly applicable to the protection devices 300, 400, 500, 600, and 700. As discussed above, each of the protection devices 300, 400, 500, 600, and 700 include some variation in the equivalent thyristor region, thereby providing a variation in the trigger voltage of the corresponding equivalent thyristor for each protection device.

As shown in FIG. 8, a thyristor 802 includes an anode 801 coupled to the bi-directional low voltage input/output (IO) terminal 106 and a cathode 803 coupled to low voltage negative power supply terminal 110. The thyristor 802 corresponds to the NPNP interfaces including at least the n-type active region 224D, p-type shallow well region 214C, n-type shallow well region 216C, p-type active region 221 respectively, as discussed above with reference to FIG. 2B. As illustrated, the thyristor 802 may be illustrated as a PNP bipolar junction transistor 804 and a NPN bipolar junction transistor 806. The PNP bipolar junction transistor 804 includes an emitter coupled to the bi-directional low voltage input/output (IO) terminal 106, a collector coupled to a cathode-gate control resistor 808 and to a base of the NPN bipolar transistor 806. A base of the PNP bipolar junction transistor 804 is coupled to the collector of the NPN bipolar junction transistor 806. A first end of the cathode-gate control resistor 808 is coupled to the base (for example, gate of the thyristor 802) of the NPN bipolar junction transistor 806 and to the collector of the PNP bipolar transistor 804, and a second end of the cathode-gate control resistor 808 is coupled to the low voltage negative power supply terminal 110.

When the voltage difference between the bi-directional low voltage input/output (IO) terminal 106 and the low voltage negative power supply terminal 110 is less than the breakdown voltage of the N-P blocking junction at the collector of the NPN bipolar transistor 806, a small amount of leakage current can flow through the thyristor 802 from the bi-directional low voltage input/output (IO) terminal 106 to the low voltage negative power supply terminal 110. However, when the voltage difference between the bi-directional low voltage input/output (IO) terminal 106 and the low voltage negative power supply terminal 110 exceeds the breakdown (for example, "trigger voltage during transient stress conditions") $V_T$ close to the breakdown of the N-P blocking junction at the collector of the NPN bipolar transistor 806, the NPN bipolar transistor 806 will begin to conduct current in a forward direction as indicated by current $I_1$ as shown in FIG. 8. The collector of the NPN bipolar transistor 806 will draw current from the base of PNP bipolar transistor 804. As a result, the PNP bipolar transistor 804 will also begin to conduct current. The PNP bipolar transistor 804, in turn, provides current to the base of NPN bipolar transistor 806, driving NPN bipolar transistor 806 further into a conducting mode. Thus, once triggered, the PNP bipolar transistor 804 and the NPN bipolar transistor 806 are in a high-conduction regenerative feedback mode that will be maintained as long as a voltage difference between the bi-directional low voltage input/output (IO) terminal 106 and the low voltage negative power supply terminal 110 is greater than the holding voltage $V_H$, or minimum on-state voltage defined by the relative gain of the embedded bipolar devices upon device activation. The thyristor 802 presents a high resistance/low leakage path until the trigger voltage $V_T$ condition is reached, but thereafter presents a low resistance path for high current to flow in a direction from the bi-directional low voltage input/output (IO) terminal 106 to the low voltage negative power supply terminal 110 to protect the bi-directional low voltage input/output (IO) terminal 106 during a transient event (such as an electrostatic discharge event). Control of the base of the PNP bipolar transistor 804 and the NPN bipolar transistor 806 further enhances the design optimization according to some embodiments. For example, the cathode-gate control resistor 808 can be customized to adjust the breakdown voltage during transient conditions of the NPN bipolar transistor 806, such that higher resistance values of the cathode-gate control resistor 808 will result in a lower trigger point. The cathode-gate resistor 808 is built-in to the protection device and is adjustable based on the implementation of the protection device. In the implementation illustrated in FIG. 2B, for example, the effective resistance of the cathode-gate resistor 808 is provided at least partially based on the p-type shallow well 214C, the p-type epitaxial layer 208, the p-type deep well 206, the high voltage p-type well 210C, the p-type shallow well 214B and the p-type active region 220C. Increasing the spacing between the regions may provide higher resistance and a lower breakdown of the NPN bipolar transistor 806, while decreasing this resistance will provide a higher trigger voltage. For example, with reference to FIG. 2B, the spacing between n-type active region 224D and p-type active region 220C may be varied in order to control the effective resistance of the cathode-gate resistor 808. By adjusting the effective resistance of the cathode-gate resistor 808, the operating condition of the protection device may be adjusted accordingly without external control components.

The resistance of the cathode-gate control resistor 808 can be varied, for example, by varying the lateral spacing as indicated above. Further, the resistance of the cathode-gate resistor 808 may be varied by varying the width of each of the doped regions. For example, the p-type deep-well region 206 in FIG. 2B may have a lateral spacing 250 as indicated in FIG. 2B of about 25 μm for sub-0.18 μm minimum dimension features technology, and up to 45 μm for up to 0.35 μm minimum dimension features technology, for example about 34 μm for 0.18 μm minimum dimension features technology. The indicated lateral spacings 350, 450, 550, 650, and 750 in FIGS. 3-7 respectively may also be similarly varied to adjust the resistance of the corresponding cathode-gate resistor 808. In some implementations, the resistance of the cathode-gate resistor 808 can vary from about 50 Ohms to about 500 kOhms. A small variation in resistance can be implemented, for example, through variation of the width of high-voltage n-type well 212C with reference to FIG. 2B. A larger variation in resistance can be implemented, for example, through variation of the width of the p-type epitaxial layer 208. The resistance of the cathode-gate resistor 808 may be set to achieve a desired stability during operation and a desired turn-on speed for a particular application.

A first diode 812 is configured to provide a reverse conduction path between the bi-directional low voltage input/output (IO) terminal 106 and the low voltage negative power supply terminal 110. The first diode 812 may be provided as a built in electrical component of the protection device which is formed at least in part by the interface between two regions having doping concentrations of different conductivity types. For example, the first diode 812 may be formed at least in part by the interface between the high voltage p-type well 210C (for example, first diode 812 anode) and the high voltage n-type well 212C (for example, first diode 812 cathode) as discussed above with reference to FIG. 2B. The first diode 812 may have a first high reverse breakdown in the range of about 15 to about 30 V, for example about 20 V, and a first diode forward bias voltage $V_{D1}$ of about 0.7 V such that when (LV $V_{SS}$)−(LV $V_{IO}$)>$V_{D1}$, the first diode 812 is triggered to conduct a current in a forward direction of the first diode 812 as indicated by current direction $I_2$ in FIG. 8.

A second diode 814 is configured to provide a forward conduction path between the bi-directional low voltage input/output (IO) terminal 106 and the low voltage positive power supply terminal 104. The second diode 814 may be provided as a built in electrical component of the protection device which is formed at least in part by the interface between two regions having doping concentrations of different conductivity types. For example, the second diode 814 may be formed at least in part by the interface between the high voltage p-type well 210B (for example, second diode 814 anode) and the high voltage n-type well 212B (for example, second diode 814 cathode) as discussed above with reference to FIG. 2B. The second diode 814 may have a second diode high reverse breakdown in the range of about 15 to about 30 V, for example about 20 V, and a second diode forward bias voltage $V_{D2}$ of about 0.7 V such that when a voltage difference (LV $V_{IO}$)−(LV $V_{DD}$)>$V_{D2}$, the second diode 814 is triggered to conduct a current in a forward direction of the second diode 814 as indicated by current direction $I_3$ in FIG. 8.

A third diode 816 is configured to provide a forward conduction path between the low voltage negative power supply terminal 110 and the low voltage positive power supply terminal 104. The third diode 816 may be provided as a built in electrical component of the protection device which is formed at least in part by the interface between two regions having doping concentrations of different conductivity types. For example, the third diode 816 may be formed at least in part by the interface between the high voltage p-type well 210C and the high voltage n-type well 212B as discussed above with reference to FIG. 2B. The third diode 816 may have a third diode high reverse breakdown in the range of about 15 to about 30 V, for example about 20 V, and a third diode forward bias voltage $V_{D3}$ of about 0.7 V such that when a voltage difference ((LV $V_{SS}$)−(LV $V_{DD}$))>$V_{D3}$, the third diode 816 is triggered to conduct a current in a forward direction of the third diode 816 as indicated by current direction $I_4$ in FIG. 8.

A fourth diode 818 is configured to provide a forward conduction path between the high voltage negative power supply terminal 108 and the low voltage positive power supply terminal 104. The fourth diode 818 may be provided as a built in electrical component of the protection device which is formed at least in part by the interface between two regions having doping concentrations of different conductivity types. For example, the fourth diode 818 may be formed at least in part by the interface between the high voltage p-type well 210A (for example, fourth diode 818 anode) and the high voltage n-type well 212A (for example, fourth diode 818 cathode) as discussed above with reference to FIG. 2B. The fourth diode 818 may have a high reverse breakdown in the range of about 70 to about 120 V, for example about 100 V for a 60V process, and a fourth diode forward bias voltage $V_{D4}$ of about 0.8 V such that when a voltage difference (HV $V_{SS}$)−(LV $V_{DD}$)>$V_{D4}$, the fourth diode 818 is triggered to conduct a current in a forward direction of the fourth diode 818 as indicated by current direction $I_5$ in FIG. 8. The first diode 812, the second diode 814, the third diode 816, and the fourth diode 818 may be referred to as decoupling components of the protection device that are configured to decouple the corresponding voltage terminals as discussed above.

A low voltage protection clamp 820 may also be coupled to the protection device and may be configured to function as a power supply current clamp. The low voltage protection clamp 820 can be configured to conduct a current in a forward direction as indicated by current $I_6$ in FIG. 8. In some implementations, the low voltage protection clamp 820 may be configured to provide a low resistance during conduction of current between the low voltage positive power supply terminal 104 to the low-voltage negative power supply terminal 110 during a stress condition between the bi-directional low-voltage input/output terminal, 106 and the voltage supply terminals 110 and 104. For example, during a condition in which the bi-directional low-voltage input/output terminal, 106 is stressed negatively versus the low-voltage positive power supply terminal 104, current is conducted from low-voltage positive power supply terminal 104 via the low-voltage protection clamp 820 to the low-voltage negative power supply terminal 110, (for example, current $I_6$ as shown in FIG. 8), and from low-voltage negative power supply terminal 110 to the bi-directional low-voltage input/output terminal 106 (for example, current $I_2$ as shown in FIG. 8). As shown in FIG. 8, the protection device is configured to provide all the necessary built-in path-up to power-high terminals and path-down to power-low terminals.

As illustrated in FIG. 8, the equivalent protection device also includes an effective PNP bipolar transistor 810. The PNP bipolar transistor 810 includes an emitter coupled to the low voltage negative power supply terminal 110, a base coupled to the low voltage positive power supply terminal 104, and a collector coupled to the high voltage negative power supply terminal 108. For example, with reference to FIG. 2B, the PNP bipolar transistor 810 may be formed by the deep p-type well 206 (effective emitter), the n-type buried layer 204 (effective base), and the substrate 102 having a p-type doping concentration (effective collector). The PNP bipolar transistor 810 is configured to provide isolation between the low voltage negative power supply terminal 110 and the high voltage negative power supply terminal 108, and between the low voltage positive power supply terminal 104 and the high voltage negative power supply terminal 108.

As illustrated in FIG. 8, and as discussed above with reference to FIG. 3-7, the conduction paths $I_1$-$I_6$ are built into a single structure. The structure includes dual-deep-well isolation regions corresponding to the n-type buried layer 204 and the deep p-type well 206. As a result, the protection device exhibits improved robustness and reduced area relative to conventional devices.

Figure 9A:
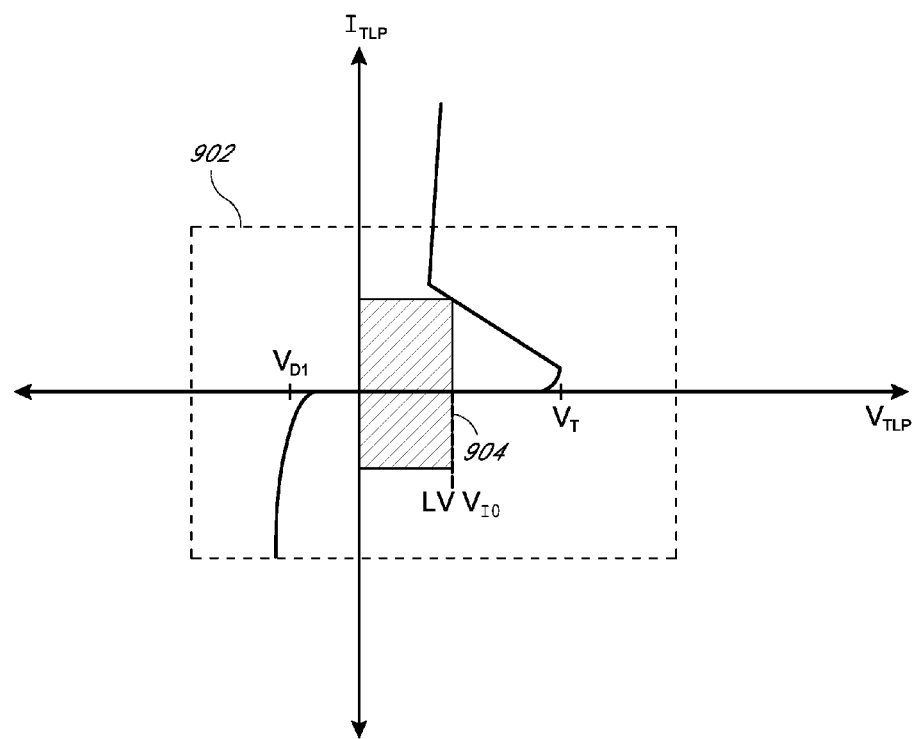
FIGS. 9A-9B depict quasi-static transmission line pulse (TLP)-type conduction path characteristics of a protection device according to some implementations for LV $V_{IO}$ to LV $V_{SS}$ and LV $V_{IO}$ to LV $V_{DD}$, respectively.
Figure 9B:
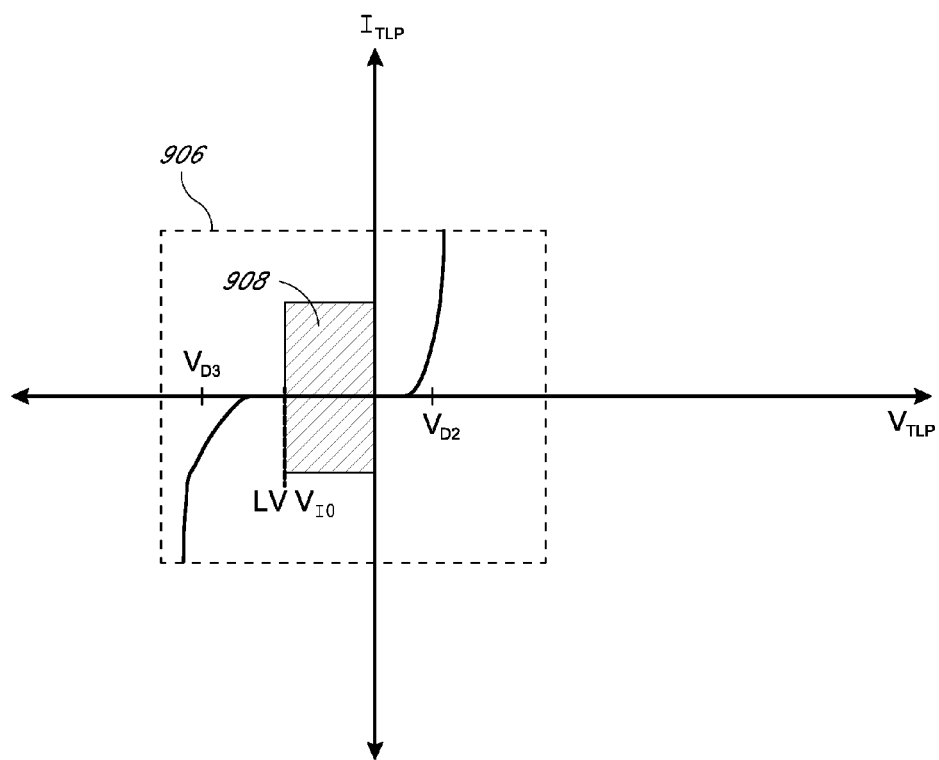

FIGS. 9A-9B illustrate examples of performance characteristics of a protection device. The illustrated examples may correspond to the performance of the protection devices 100, 200, 300, 400, 500, 600, and 700 discussed above. For ease of comprehension, the performance characteristics are discussed with reference to the equivalent circuit diagram of FIG. 8. FIG. 9A illustrates an example of TLP test showing a voltage and a current measurement obtained by forcing a current pulse, for example a rectangular 100 ns current pulse having about a 2 ns rise time, into a protection device and measuring the voltage difference between the bi-directional low voltage input/output (IO) terminal 106 and the low voltage negative power supply terminal 110 (for example, LV $V_{IO}$-LV $V_{SS}$) in an area that is about 40% and about 90% of the rectangular pulse width. The plot shown in FIG. 9A includes an ESD protection window 902 which corresponds to the voltage levels of transient events that may be encountered by a circuit. An operational area 904 illustrates the operating region equal to the voltage difference between LV $V_{IO}$-LV $V_{SS}$ of a circuit (for example, circuit 105 as discussed above with reference to FIG. 1). As shown in FIG. 9A, for positive voltage differences (LV $V_{IO}$-LV $V_{SS}$) that exceed the trigger voltage $V_T$ of the thyristor (for example, thyristor 802), a snapback effect occurs to a lower voltage difference through an increased current in a forward direction (for example, current direction $I_1$ as shown in FIG. 8) between the bi-directional low voltage input/output (IO) terminal 106 and the low voltage negative power supply terminal 110. For negative voltage differences (LV $V_{IO}$-LV $V_{SS}$) that exceed the forward bias voltage $V_{D1}$ of a first diode (for example, first diode 812), the voltage difference is substantially maintained by an increased current in a reverse direction (for example, current direction $I_2$ as shown in FIG. 8) between the bi-directional low voltage input/output (IO) terminal 106 and the low voltage negative power supply terminal 110.

FIG. 9B illustrates an example of TLP test showing a voltage and a current measurement obtained by forcing a current pulse, for example a rectangular 100 ns current pulse having about a 2 ns rise time, into a protection device and measuring the voltage difference between the bi-directional low voltage input/output (IO) terminal 106 and the low voltage positive power supply terminal 104 (for example, LV $V_{IO}$-LV $V_{DD}$) in an area that is about 40% and about 90% of the rectangular pulse width. As shown in FIG. 9B, for positive voltage differences (LV $V_{IO}$-LV $V_{DD}$) that exceed a forward bias voltage $V_{D2}$ of a second diode (for example, second diode 814), the voltage difference is substantially maintained by an increased current in a forward direction (for example, current direction $I_3$ as shown in FIG. 8) between the bi-directional low voltage input/output (IO) terminal 106 and the low voltage positive power supply terminal 104. For negative voltage differences that exceed a forward bias voltage $V_{D3}$ (for example, 0.7 V) of a third diode (for example, third diode 816), the voltage difference is substantially maintained by an increased current in a direction (for example, current direction $I_4$ as shown in FIG. 8) between the bi-directional low voltage input/output (IO) terminal 106 and the low voltage positive power supply terminal 104. The current level during this stage is also partially provided as a function of a power source current (for example, from low voltage protection clamp 820) in a direction between the low voltage positive power supply terminal 104 and the low voltage negative power supply terminal 110 (for example, current direction $I_6$ as shown in FIG. 8).

Applications

The implementations described above may enable protection in general purpose input/outputs circuits. For example, the implementations described above may be integrated with circuits that are configured to operate at a first level low voltage reference and which include a substrate that is biased at a negative high voltage substantially below the low voltage interface reference.

Devices employing the above described schemes can be implemented into various high performance and high speed electronic devices and interface applications operating in harsh electrical environments. Examples of the electronic devices can include, but are not limited to, consumer electronic products, parts of the consumer electronic products, electronic test equipment, high robustness industrial and automotive applications, etc. Examples of the electronic devices can also include circuits of optical networks or other communication networks. The consumer electronic products can include, but are not limited to, an automobile, a vehicle engine management controller, a transmission controller, an anti-lock brake system controller, a camcorder, a camera, a digital camera, a portable memory chip, a multi functional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual implementation (assuming that the functionality of the depicted circuits is not adversely affected).

Although this invention has been described in terms of certain implementations, other implementations that are apparent to those of ordinary skill in the art, including implementations that do not provide all of the features and advantages set forth herein, are also within the scope of this invention. Moreover, the various implementations described above can be combined to provide further implementations. In addition, certain features shown in the context of one implementation can be incorporated into other implementations as well. Accordingly, the scope of the present invention is defined only by reference to the appended claims.

What is claimed is:
1. An apparatus comprising:
a substrate of a first conductivity type;
a first isolation region disposed on the substrate of a second conductivity type that is opposite to the first conductivity type;
a second isolation region disposed on the first isolation region of the first conductivity type;
an epitaxial layer disposed on the substrate of the first conductivity type;
a thyristor region disposed on the epitaxial layer, the thyristor region comprising a thyristor gate region, a thyristor anode region, a thyristor cathode region, and a thyristor cathode-gate resistance-control region;
the thyristor anode region being coupled to an input/output voltage terminal,
the thyristor cathode region and the cathode-gate resistance-control region being coupled to a first voltage source terminal,
a first decoupling component region comprising a first decoupling component anode region at least partially abutting a first decoupling component cathode region, wherein the first decoupling component anode region is coupled to the first voltage source terminal, and wherein the first decoupling component cathode region is coupled to the input/output voltage terminal; and
a second decoupling component region comprising a second decoupling component anode region at least partially abutting a second decoupling component cathode region, wherein the second decoupling component anode region is coupled to the first voltage source terminal, and wherein the second decoupling component cathode region is coupled to a second voltage source terminal.
2. The apparatus of claim 1, wherein the thyristor anode region comprises a thyristor anode active region, and wherein the thyristor region further comprises a plurality of blocking regions disposed between thyristor anode active region and the thyristor cathode region.

3. The apparatus of claim 1, further comprising:
a third isolation decoupling component region comprising a third decoupling component anode region at least partially abutting along a first surface a third decoupling component cathode region, wherein the third decoupling component anode region is coupled to the input/output voltage terminal, and wherein the third decoupling component cathode region is coupled to the second voltage source terminal.
4. The apparatus of claim 3, further comprising:
a fourth decoupling component region comprising a fourth decoupling component anode region and a fourth decoupling component cathode region, wherein the fourth decoupling component anode region is coupled to a third voltage source terminal, and wherein the fourth decoupling component cathode region, at least partially abutting a second surface of the third decoupling component anode region, the fourth decoupling cathode region being coupled to the second voltage source terminal.
5. The apparatus of claim 1, wherein the first conductivity type comprises a p-type doping concentration, and wherein the second conductivity type comprises an n-type doping concentration.
6. The apparatus of claim 1, wherein the first isolation region and the second isolation region are configured to provide isolation between the substrate and the active areas of the protection device.
7. The apparatus of claim 1, wherein the first decoupling component comprises a first diode and the second decoupling component comprises a second diode.
8. The apparatus of claim 1, further comprising a plurality of first well regions disposed on the substrate and a plurality of second well regions disposed on the plurality of first well regions, the plurality of first well regions having a first doping concentration and the plurality of second well regions having a second doping concentration that is higher than the first doping concentration.
9. The apparatus of claim 8, further comprising a plurality of active regions disposed on the plurality of second well regions, the plurality of active regions having a third doping concentration that is higher than the second doping concentration.
10. The apparatus of claim 1, wherein the thyristor gate region is configured to be electrically floating.
11. The apparatus of claim 1, wherein the thyristor region comprises:
a thyristor well region having a first doping concentration of the second conductivity type;
a thyristor active area disposed on the thyristor well region, the first thyristor active area having a second doping concentration of the second conductivity type, the second doping concentration being greater than the first doping concentration,
wherein the thyristor gate region is at least partially disposed on the thyristor well region, the thyristor gate region having the second doping concentration of the first conductivity type.
12. The apparatus of claim 1, wherein the thyristor region comprises:
a thyristor well region having a first doping concentration of the second conductivity type;
a thyristor active area formed at least partially disposed on the thyristor well region, the thyristor active area having a second doping concentration of the second conductivity type, the second doping concentration being greater than the first doping concentration.

13. The apparatus of claim 12, further comprising a highly conductive material layer disposed on the thyristor active area.

14. The apparatus of claim 1, wherein the thyristor region comprises a thyristor well region having a first doping concentration of the second conductivity type, wherein the thyristor anode region is disposed on a first area of the thyristor well region, and wherein a blocking region is disposed on a second area of the thyristor well region that is different than the first area.

15. The apparatus of claim 14, wherein the blocking region comprises a low resistance polysilicon material.

16. The apparatus of claim 1, wherein the thyristor region comprises a thyristor well region having a first doping concentration of the second conductivity type, wherein the thyristor anode region is disposed on a first area of the thyristor well region, and wherein a blocking and isolation region is disposed on a second area of the thyristor gate well region that is different than the first area.

17. The apparatus of claim 16, wherein the blocking and isolation region comprises a dielectric material.

18. The apparatus of claim 1, wherein the thyristor region comprises:
a thyristor well region having a first doping concentration of the second conductivity type,
wherein the thyristor gate region is disposed at least partially over the thyristor well region, the thyristor gate region having a second doping concentration of the first conductivity type, the second doping concentration being greater than the first doping concentration.

19. The apparatus of claim 7,
wherein the thyristor region, the first diode, and the second diode are each formed at least partially on a surface of the second isolation region.

20. The apparatus of claim 19, further comprising a third diode having an anode coupled to the input/output voltage terminal and a cathode coupled to the second voltage source terminal.

21. The apparatus of claim 19, further comprising a fourth diode having an anode coupled to a third voltage source terminal and a cathode coupled to the second voltage source terminal.

22. The apparatus of claim 19, wherein the first voltage source terminal has a first voltage source level of a first polarity, and wherein the second voltage source terminal has a second voltage source level of a second polarity that is different than the first polarity.

23. The apparatus of claim 19, wherein the thyristor cathode-gate resistance-control region has an effective resistance that is based at least partially on a dimension of the second isolation region.

* * * * *

UNITED STATES PATENT AND TRADEMARK OFFICE
CERTIFICATE OF CORRECTION

PATENT NO. : 8,637,899 B2  Page 1 of 1
APPLICATION NO. : 13/492677
DATED : January 28, 2014
INVENTOR(S) : Javier A. Salcedo It is certified that error appears in the above-identified patent and that said Letters Patent is hereby corrected as shown below:

In The Claims

At Col. 18, line 51 (approx.), Claim 11, please delete "first".

Signed and Sealed this
Twelfth Day of April, 2016

Michelle K. Lee
*Director of the United States Patent and Trademark Office*